US010964396B2

(12) United States Patent
Harada

(10) Patent No.: US 10,964,396 B2
(45) Date of Patent: Mar. 30, 2021

(54) SEMICONDUCTOR MEMORY DEVICE

(71) Applicant: TOSHIBA MEMORY CORPORATION, Minato-ku (JP)

(72) Inventor: Yoshikazu Harada, Kawasaki (JP)

(73) Assignee: TOSHIBA MEMORY CORPORATION, Minato-ku (JP)

(*) Notice: Subject to any disclaimer, the term of this patent is extended or adjusted under 35 U.S.C. 154(b) by 1 day.

(21) Appl. No.: 16/568,555

(22) Filed: Sep. 12, 2019

(65) Prior Publication Data

US 2020/0294603 A1 Sep. 17, 2020

(30) Foreign Application Priority Data

Mar. 13, 2019 (JP) .............................. JP2019-046225

(51) Int. Cl.
G11C 16/04 (2006.01)
G11C 16/16 (2006.01)
G11C 16/26 (2006.01)
G11C 16/34 (2006.01)
G11C 16/10 (2006.01)

(52) U.S. Cl.
CPC .......... *G11C 16/16* (2013.01); *G11C 16/0483* (2013.01); *G11C 16/107* (2013.01); *G11C 16/26* (2013.01); *G11C 16/3445* (2013.01); *G11C 16/3459* (2013.01); *G11C 2211/5621* (2013.01)

(58) Field of Classification Search
CPC ... G11C 16/16; G11C 16/0483; G11C 16/107; G11C 16/26

USPC ..................................................... 365/185.29
See application file for complete search history.

(56) References Cited

U.S. PATENT DOCUMENTS

| 6,775,187 B1* | 8/2004 | Hamilton ............... G11C 16/10 365/185.24 |
| 8,537,612 B2 | 9/2013 | Kang |
| 8,539,315 B2 | 9/2013 | Hashimoto |
| 9,135,968 B2 | 9/2015 | Lee et al. |
| 9,396,775 B2 | 7/2016 | Shirakawa et al. |
| 9,704,596 B1* | 7/2017 | Shim ................... G06F 11/1068 |
| 9,875,804 B2 | 1/2018 | Tokiwa |
| 2006/0133155 A1 | 6/2006 | Fujita et al. |
| 2006/0158940 A1 | 7/2006 | Shappir et al. |

(Continued)

FOREIGN PATENT DOCUMENTS

| JP | 2006-164408 A | 6/2006 |
| JP | 2013-145545 A | 7/2013 |

(Continued)

*Primary Examiner* — Vu A Le
(74) *Attorney, Agent, or Firm* — Oblon, McClelland, Maier & Neustadt, L.L.P.

(57) ABSTRACT

A semiconductor memory device includes first and second bit lines, first and second memory transistors connected to the respective first and second bit lines, a source line connected to the first and second memory transistors, and a word line connected to gate electrodes of the first and second memory transistors. In an erase operation that erases data in the first and second memory transistors: a first erase voltage application operation is performed; an erase verify operation is performed on only one of the first and second memory transistors; and a second erase voltage application operation is performed without performing the erase verify operation on another of the first and second memory transistors.

17 Claims, 21 Drawing Sheets

(56) References Cited

U.S. PATENT DOCUMENTS

| | | | |
|---|---|---|---|
| 2014/0016393 A1* | 1/2014 | Kunihiro | G11C 11/005 365/94 |
| 2017/0262229 A1 | 9/2017 | Ochi et al. | |
| 2019/0115070 A1 | 4/2019 | Harada | |
| 2019/0392905 A1 | 12/2019 | Hioka et al. | |

FOREIGN PATENT DOCUMENTS

| | | |
|---|---|---|
| JP | 2015-176309 A | 10/2015 |
| JP | 2017-157259 A | 9/2017 |
| JP | 2019-75180 A | 5/2019 |
| JP | 6538597 B2 | 7/2019 |
| JP | 2020-4466 A | 1/2020 |

* cited by examiner

SEMICONDUCTOR MEMORY DEVICE

CROSS-REFERENCE TO RELATED APPLICATIONS

This application is based upon and claims the benefit of Japanese Patent Application No. 2019-046225, filed on Mar. 13, 2019, the entire contents of which are incorporated herein by reference.

FIELD

Embodiments described herein relate generally to a semiconductor memory device.

BACKGROUND

Description of the Related Art

There has been known a semiconductor memory device including a plurality of memory transistors.

DETAILED DESCRIPTION

Figure 1:
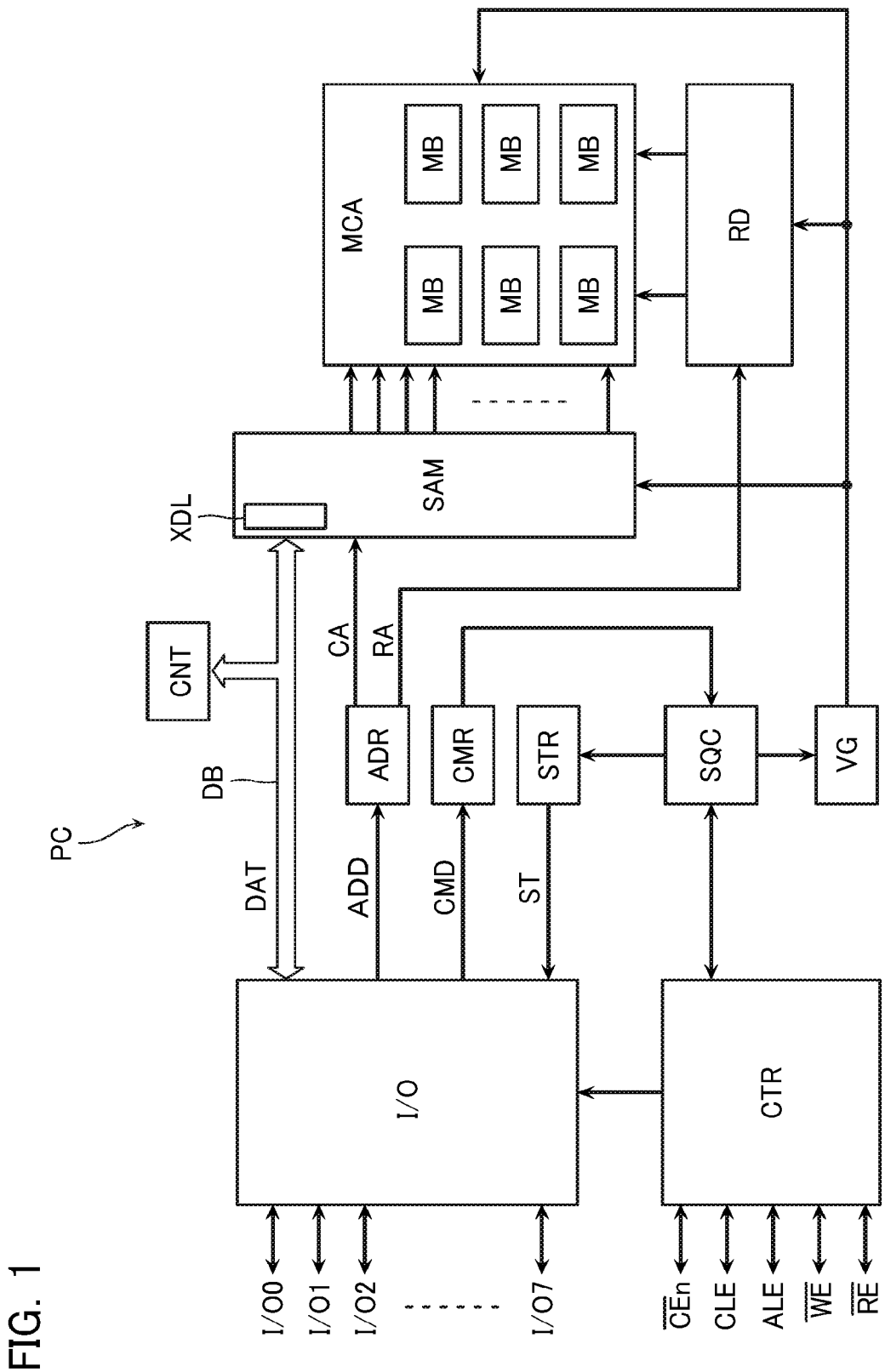
FIG. 1 is a schematic block diagram illustrating a configuration of a semiconductor memory device according to a first embodiment.

A semiconductor memory device according to one embodiment includes a first bit line and a second bit line, a first memory transistor, a second memory transistor, a source line, and a word line. The first memory transistor is connected to the first bit line. The second memory transistor is connected to the second bit line. The source line is connected to the first memory transistor and the second memory transistor. The word line is connected to a gate electrode of the first memory transistor and a gate electrode of the second memory transistor. In an erase operation that erases data in the first memory transistor and the second memory transistor: a first erase voltage application operation is performed; an erase verify operation is performed on only one of the first memory transistor and the second memory transistor; and a second erase voltage application operation is performed without performing the erase verify operation on another of the first memory transistor and the second memory transistor.

A semiconductor memory device according to one embodiment includes a first bit line and a second bit line, a first memory transistor, a second memory transistor, a source line, and a word line. The first memory transistor is connected to the first bit line. The second memory transistor is connected to the second bit line. The source line is connected to the first memory transistor and the second memory transistor. The word line is connected to a gate electrode of the first memory transistor and a gate electrode of the second memory transistor. In an erase operation that erases data in the first memory transistor and the second memory transistor: the erase operation starts; a pre-read operation is performed on only one of the first memory transistor and the second memory transistor; and an erase voltage application operation is performed without performing the pre-read operation on another of the first memory transistor and the second memory transistor.

A semiconductor memory device according to one embodiment includes a memory block, a peripheral circuit, and a pad electrode. The memory block includes a plurality of memory transistors. The peripheral circuit is connected to the memory block. With the pad electrode, electric power can be supplied to the peripheral circuit. When a read operation is performed on the memory transistor while the plurality of memory transistors included in the memory block are in an erase state, a first current flows through the pad electrode. When an erase operation is performed on the memory transistors while the plurality of memory transistors included in the memory block are in the erase state, a second current flows through the pad electrode in a pre-read operation in the erase operation. The second current is smaller than the first current.

Next, semiconductor memory devices according to embodiments are described in detail with reference to the accompanying drawings. The following embodiments are merely examples, and are not described for the purpose of limiting the present invention. The following drawings are schematic, and for sake of convenient description, a part of configurations is sometimes omitted. The descriptions of common parts in a plurality of embodiments are basically omitted.

In this specification, a direction parallel to a surface of a substrate is referred to as an X direction, a direction parallel to the surface of the substrate and perpendicular to the X direction is referred to as a Y direction, and a direction perpendicular to the surface of the substrate is referred to as a Z direction.

In this specification, a direction along a predetermined plane may be referred to as a first direction, a direction along this predetermined plane and intersecting with the first direction may be referred to as a second direction, and a direction intersecting with this predetermined surface may be referred to as a third direction. These first direction, second direction, and third direction may correspond to any of the X direction, the Y direction, and the Z direction and need not to correspond to these directions.

Expressions such as "above" and "below" in this specification are based on the substrate. For example, a direction away from the substrate along the Z direction is referred to as above and a direction approaching the substrate along the Z direction is referred to as below. A lower surface and a lower end of a certain configuration mean a surface and an end portion on the substrate side of this configuration. A top surface and an upper end of a certain configuration mean a surface and an end portion on a side opposite to the substrate of this configuration. A surface intersecting with the X direction or the Y direction is referred to as a side surface and the like.

In this specification, when referring to "semiconductor memory device", it may mean a memory die and may mean a memory system including a control die, such as a memory chip, a memory card, and an SSD. Further, it may mean a configuration including a host computer such as a smartphone, a tablet terminal, and a personal computer.

In this specification, when referring to that a first configuration "is electrically connected" to a second configuration, the first configuration may be directly connected to the second configuration, and the first configuration may be connected to the second configuration via a wiring, a semiconductor member, a transistor, or the like. For example, when three transistors are connected in series, even when the second transistor is in OFF state, the first transistor is "electrically connected" to the third transistor.

In this specification, when referring to that the first configuration "is connected between" the second configuration and a third configuration, it may mean that the first configuration, the second configuration, and the third configuration are connected in series and the first configuration is provided on a current path between the second configuration and the third configuration.

In this specification, when referring to that a circuit or the like "electrically conducts" two wirings or the like, it may mean, for example, that this circuit or the like includes a transistor or the like, this transistor or the like is disposed on a current path between the two wirings, and this transistor or the like turns ON.

First Embodiment

[Configuration]

FIG. 1 is a schematic block diagram illustrating a configuration of a semiconductor memory device according to a first embodiment.

The semiconductor memory device according to the embodiment includes a memory cell array MCA and a peripheral circuit PC controlling the memory cell array MCA.

Figure 2:
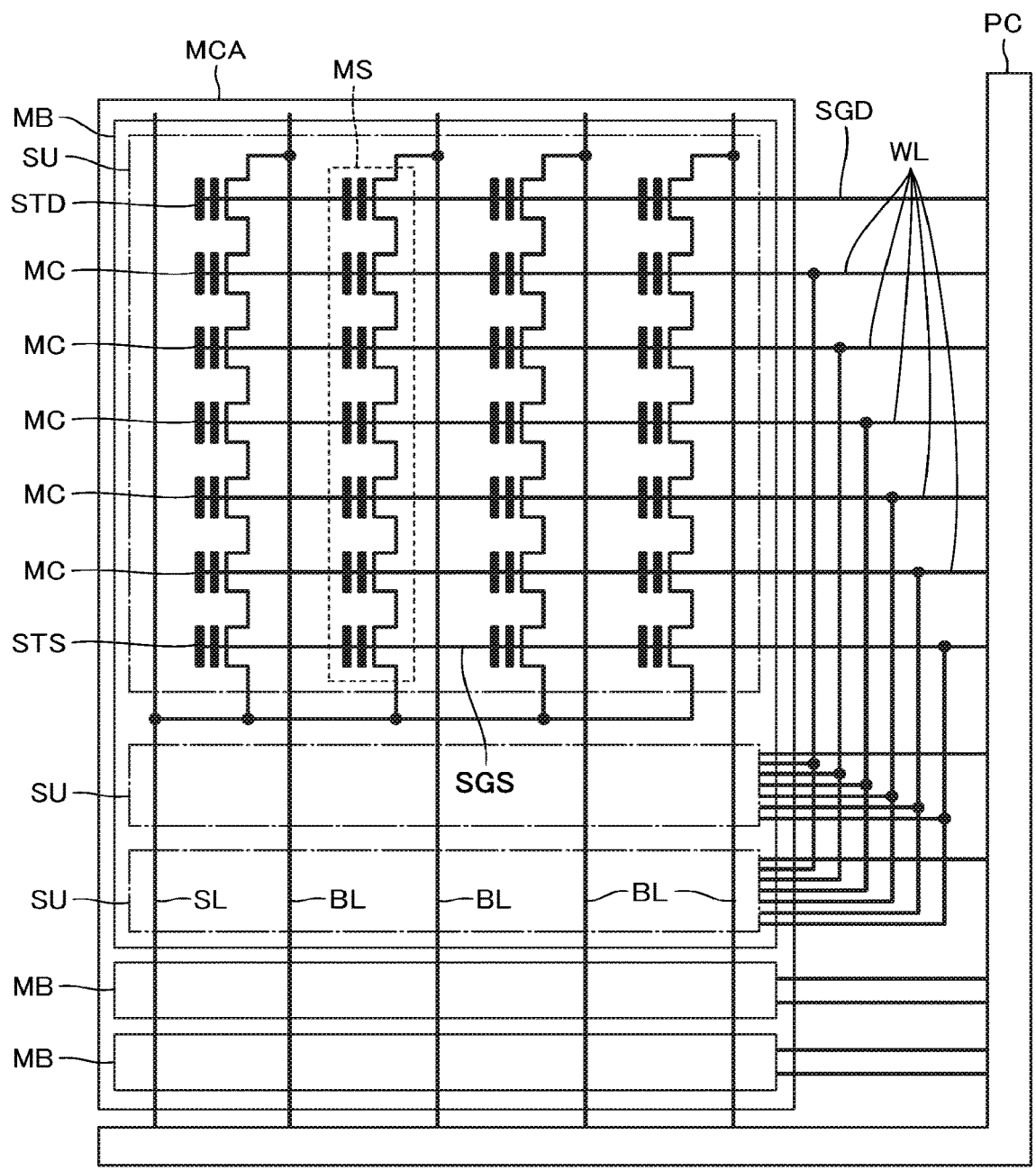
FIG. 2 is a schematic circuit diagram illustrating a configuration of a part of the semiconductor memory device according to the first embodiment.

The memory cell array MCA includes a plurality of memory blocks MB. As illustrated in FIG. 2, the plurality of memory blocks MB each include a plurality of string units SU. The plurality of string units SU each include a plurality of memory strings MS. The plurality of memory strings MS have one ends each connected to the peripheral circuit PC via a bit line BL. The plurality of memory strings MS have other ends each connected to the peripheral circuit PC via a common source line SL.

The memory string MS includes a drain select transistor STD, a plurality of memory cells MC, and a source select transistor STS, which are connected in series between the bit line BL and the source line SL. Hereinafter, the drain select transistor STD and the source select transistor STS may be simply referred to as select transistors (STD, STS).

The memory cell MC is a field-effect type transistor including a semiconductor layer that functions as a channel region, a gate insulating film including an electric charge accumulating film, and a gate electrode. The memory cell MC has a threshold voltage that varies according to an electric charge amount in the electric charge accumulating film. The respective gate electrodes of the plurality of memory cells MC corresponding to one memory string MS are connected to word lines WL. These respective word lines WL are connected to all the memory strings MS in one memory block MB in common.

The select transistor (STD, STS) is a field-effect type transistor including a semiconductor layer that functions as a channel region, a gate insulating film, and a gate electrode. The respective gate electrodes of the select transistors (STD, STS) are connected to select gate lines (SGD, SGS). The drain select line SGD is provided corresponding to the string unit SU and connected to all the memory strings MS in one string unit SU in common. The source select line SGS is connected to all the memory strings MS in one memory block MB in common.

The peripheral circuit PC, as illustrated in FIG. 1, includes a row decoder RD, a sense amplifier module SAM, a voltage generation circuit VG, a count circuit CNT, and a sequencer SQC. The peripheral circuit PC includes an address register ADR, a command register CMR, and a status register STR. The peripheral circuit PC includes an input/output control circuit I/O and a logic circuit CTR.

The row decoder RD includes, for example, a decode circuit and a switch circuit. The decode circuit decodes a row address RA latched in the address register ADR. The switch circuit electrically conducts the word line WL and the select gate line (SGD, SGS) corresponding to the row address RA with corresponding voltage supply lines in accordance with an output signal of the decode circuit.

Figure 3:
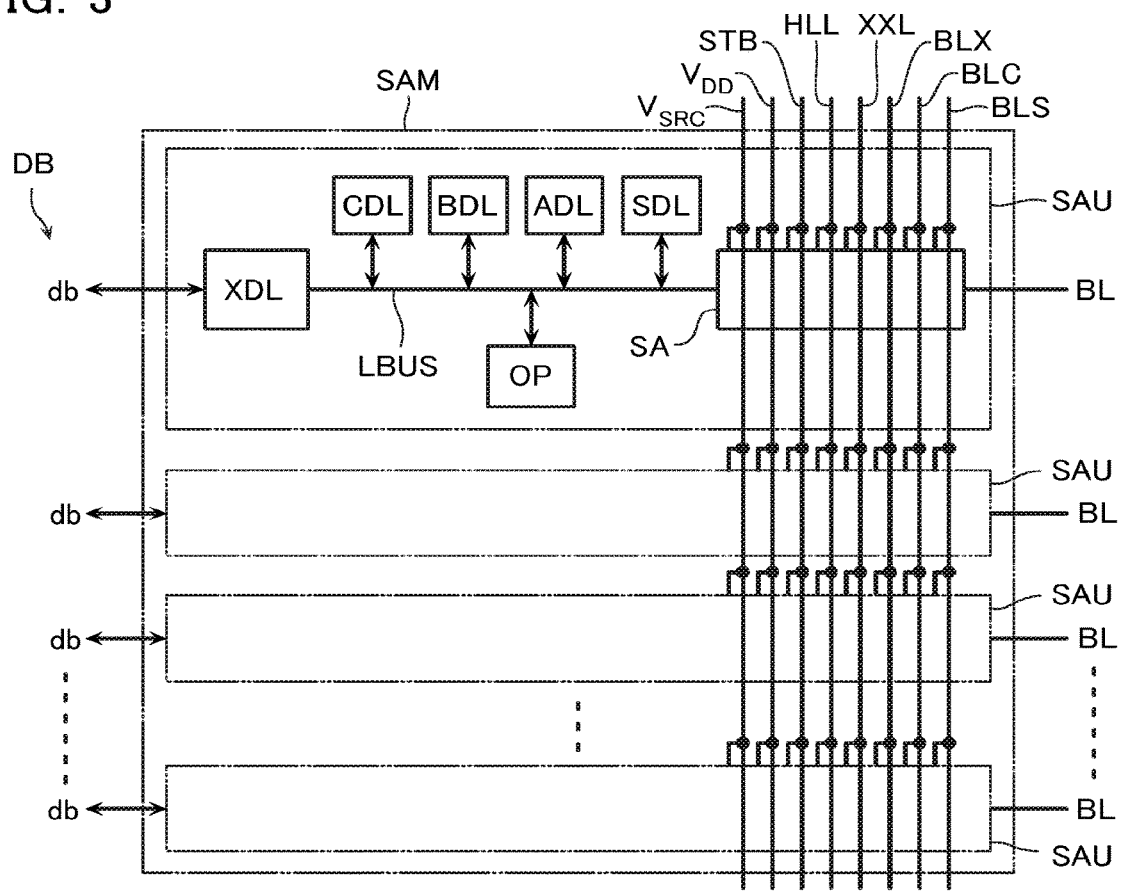
FIG. 3 is a schematic block diagram illustrating a configuration of a part of the semiconductor memory device according to the first embodiment.

The sense amplifier module SAM, as illustrated in FIG. 3, includes a plurality of sense amplifier units SAU corresponding to the plurality of bit lines BL. The sense amplifier unit SAU includes a sense amplifier SA connected to the bit line BL, data latches SDL, ADL, BDL, CDL, and XDL, a logic circuit OP, and a wiring LBUS connected to these components.

Figure 4:
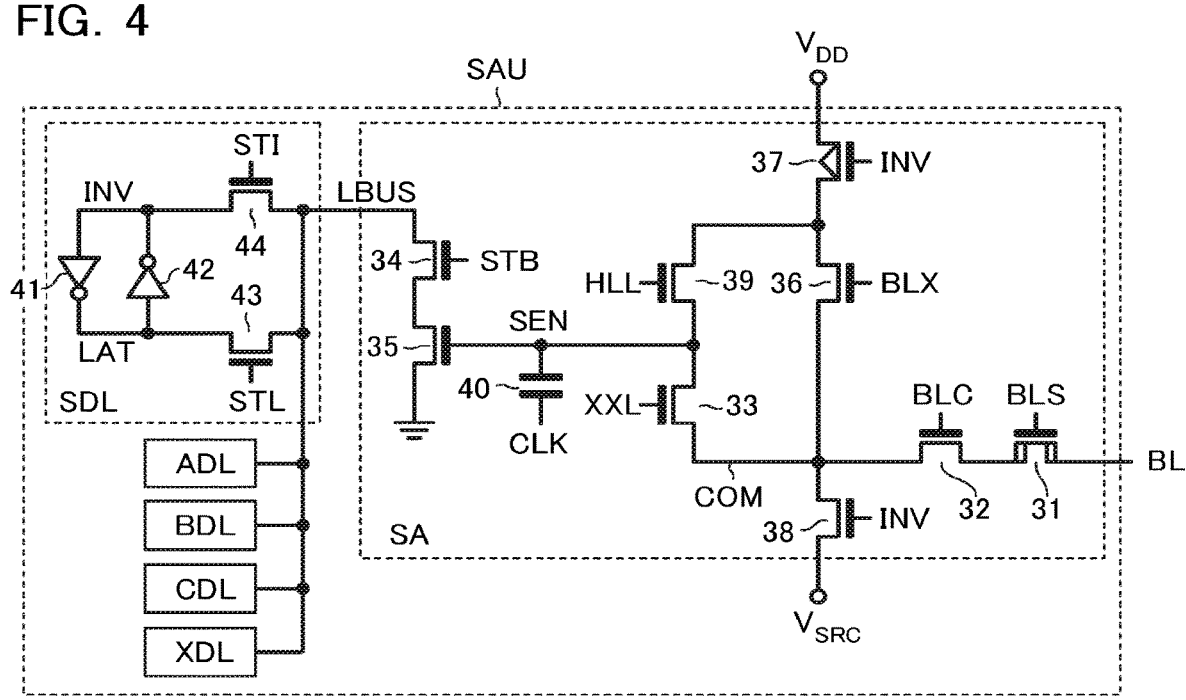
FIG. 4 is a schematic circuit diagram illustrating a configuration of a part of the semiconductor memory device according to the first embodiment.

The sense amplifier SA, as illustrated in FIG. 4, includes a high withstand voltage transistor 31, a clamp transistor 32, a node COM, and a discharge transistor 33 connected in series between the bit line BL and a sense node SEN. Additionally, the sense amplifier SA includes a switch transistor 34 and a sense transistor 35 connected in series between the wiring LBUS and a ground voltage supply line. The ground voltage supply line is connected to a pad electrode for supplying a ground voltage $V_{SS}$.

The high withstand voltage transistor 31 is an NMOS type transistor having a high withstand voltage. For example, when a comparatively large voltage is supplied to the source line SL (FIG. 2), the high withstand voltage transistor 31 protects the sense amplifier SA. To a gate electrode of the high withstand voltage transistor 31, a control signal from the sequencer SQC is supplied via a signal line BLS.

The clamp transistor 32 is an NMOS type transistor. The clamp transistor 32 controls a voltage of the bit line BL. To a gate electrode of the clamp transistor 32, a control signal from the sequencer SQC is supplied via a signal line BLC.

The node COM is connected to a power voltage supply line $V_{DD}$ via a charge transistor 36 and a charge transistor 37. The power voltage supply line $V_{DD}$ is connected to a pad electrode for supplying a power supply voltage. The node COM is connected to a voltage supply line $V_{SRC}$ via a discharge transistor 38. The charge transistor 36 and the discharge transistor 38 are NMOS type transistors. The charge transistor 37 is a PMOS type transistor. To a gate electrode of the charge transistor 36, a control signal from the sequencer SQC is supplied via a signal line BLX. Respective gate electrodes of the charge transistor 37 and the discharge transistor 38 are connected to a node INV of the data latch SDL.

The discharge transistor 33 is an NMOS type transistor. The discharge transistor 33 discharges an electric charge in the sense node SEN. To a gate electrode of the discharge transistor 33, a control signal from the sequencer SQC is supplied via a signal line XXL.

The sense node SEN is connected to the power voltage supply line $V_{DD}$ via a charge transistor 39 and the charge transistor 37. The sense node SEN is connected to a signal line CLK via a capacitor 40. To this signal line CLK, a control signal from the sequencer SQC is supplied. The charge transistor 39 is an NMOS type transistor. To a gate electrode of the charge transistor 39, a control signal from the sequencer SQC is supplied via a signal line HLL.

The switch transistor 34 is an NMOS type transistor. The switch transistor 34 electrically conducts the wiring LBUS and the sense transistor 35. To a gate electrode of the switch transistor 34, a control signal from the sequencer SQC is supplied via a signal line STB.

The sense transistor 35 is an NMOS type transistor. The sense transistor 35 discharges or maintains an electric charge in the wiring LBUS according to a voltage of the sense node SEN. The sense transistor 35 has a gate electrode connected to the sense node SEN.

As exemplified in FIG. 3, in the embodiment, the respective above-described signal lines BLS, BLC, BLX, XXL, HLL, and STB are connected to all the sense amplifier units SAU included in the sense amplifier module SAM in common. In the embodiment, the respective above-described power voltage supply line $V_{DD}$ and voltage supply line $V_{SRC}$ are connected to all the sense amplifier units SAU included in the sense amplifier module SAM in common.

As illustrated in FIG. 4, the data latch SDL includes a node LAT and the node INV, inverters 41 and 42 connected in parallel between these node LAT and node INV, a switch transistor 43 connected between the node LAT and the wiring LBUS, and a switch transistor 44 connected between the node INV and the wiring LBUS. An output terminal of the inverter 41 and an input terminal of the inverter 42 are connected to the node LAT. An input terminal of the inverter 41 and an output terminal of the inverter 42 are connected to the node INV. Although the illustration is omitted, the data latches ADL, BDL, CDL, and XDL have configurations similar to that of the data latch SDL.

To the data latches ADL, BDL, and CDL, for example, data latched in the data latch SDL is appropriately transferred. The logic circuit OP (FIG. 3), for example, performs a logical operation such as AND, OR, and XOR on the data in the data latches ADL, BDL, and CDL, thus calculating user data stored to the memory cell MC.

The data latch XDL is connected to the wiring LBUS and a wiring db (FIG. 3) constituting a bus DB. The data latch XDL latches, for example, the user data written to the memory cell MC or the user data read from the memory cell MC.

The sense amplifier module SAM includes a decode circuit and a switch circuit (not illustrated). The decode circuit decodes a column address CA latched in the address register ADR (FIG. 1). The switch circuit electrically conducts the data latch XDL corresponding to the column address CA with the bus DB, in accordance with an output signal of the decode circuit.

The voltage generation circuit VG (FIG. 1) includes, for example, a step up circuit such as a charge pump circuit and a step down circuit such as a regulator. The step up circuit and the step down circuit are connected to the power voltage supply line $V_{DD}$ and the ground voltage supply line. Additionally, the voltage generation circuit VG (FIG. 1) includes a plurality of voltage supply lines (not illustrated). The voltage generation circuit VG generates a plurality of operating voltages supplied to the bit line BL, the source line SL, the word line WL, and the select gate lines (SGD, SGS) and simultaneously output the plurality of operating voltages to the plurality of voltage supply lines, in a read operation, a write operation, and an erase operation for the memory cell array MCA, in response to an internal control signal from the sequencer SQC.

The count circuit CNT is connected to the bus DB and counts the number of bits indicative of "1" and the number of bits indicative of "0" among the data contained in the data latch XDL. The count circuit CNT can count the number of bits indicative of "1" or "0" based on the data latched in all the data latches XDL. Additionally, the count circuit CNT can perform sampling and count the number of bits after that. For example, a plurality of data latches XDL in the sense amplifier module SAM can be selected as samples, and number of bits indicative of "1" or "0" can be counted from data latched in the selected data latches XDL.

The sequencer SQC sequentially decodes command data CMD latched in the command register CMR and outputs the command data CMD as the internal control signal via a plurality of signal lines to the row decoder RD, the sense amplifier module SAM, the voltage generation circuit VG, and the count circuit CNT. The sequencer SQC outputs status data indicating its own state to the status register STR as necessary. For example, in performing the write operation or the erase operation, information indicative of whether the write operation or the erase operation has been normally ended or not is output as the status data.

The input/output control circuit I/O includes data input/output terminals I/O0 to I/O7, a shift register connected to these data input/output terminals I/O0 to I/O7, and a FIFO buffer connected to this shift register. The input/output terminals I/O0 to I/O7 are eight pad electrodes. The input/output control circuit I/O is input data via the data input/output terminals I/O0 to I/O7 and outputs the data to the data latch XDL in the sense amplifier module SAM, the address register ADR, or the command register CMR, in accordance with the internal control signal from the logic circuit CTR. The input/output control circuit I/O is input data from the data latch XDL or the status register STR and outputs the data via the data input/output terminals I/O0 to I/O7.

The logic circuit CTR receives an external control signal from a control die CD via external control terminals/CEn, CLE, ALE, /WE, and /RE and outputs the internal control signal to the input/output control circuit I/O in accordance with the external control signal.

Figure 5:
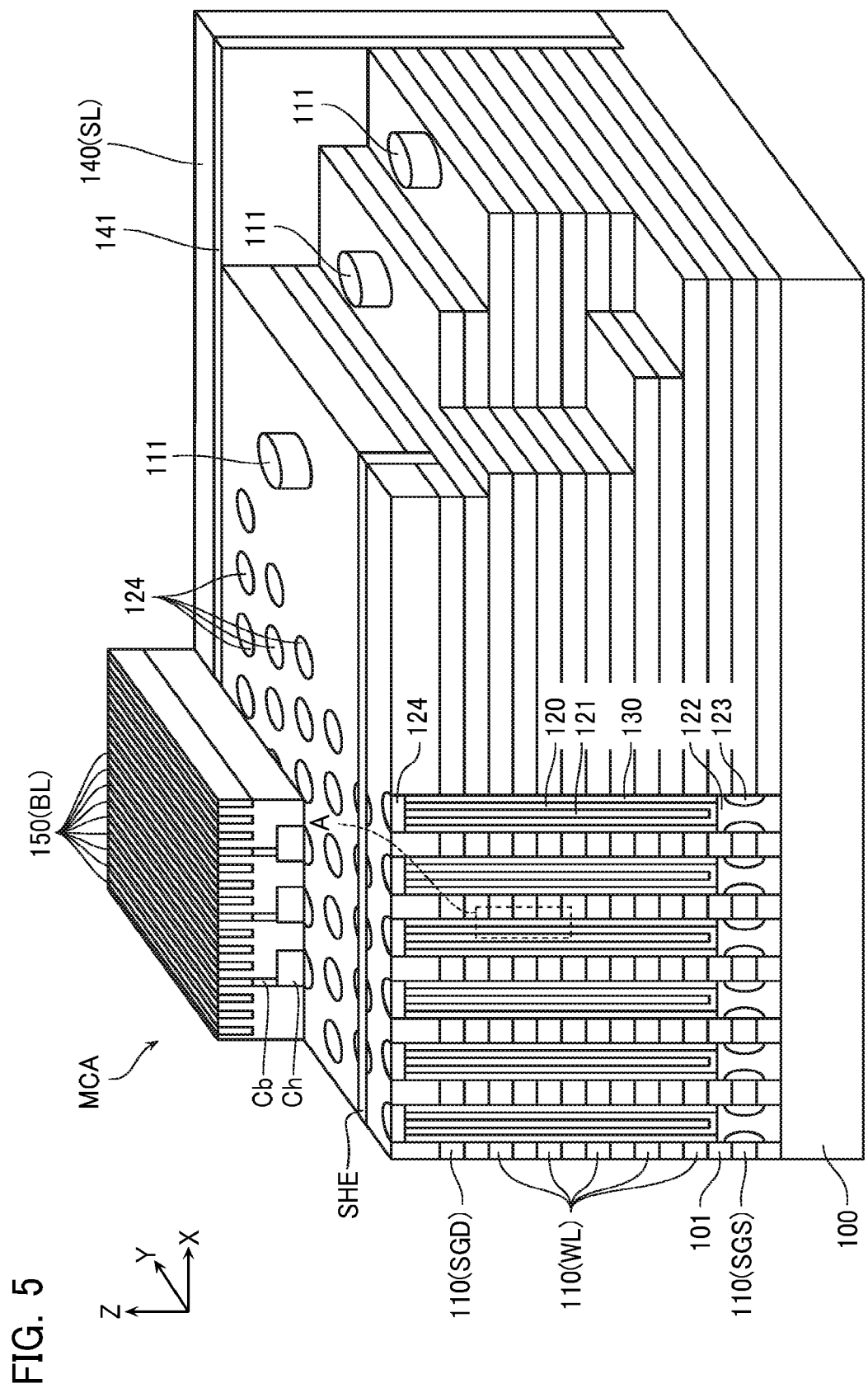
FIG. 5 is a schematic perspective view illustrating a configuration of a part of the semiconductor memory device according to the first embodiment.
Figure 6:
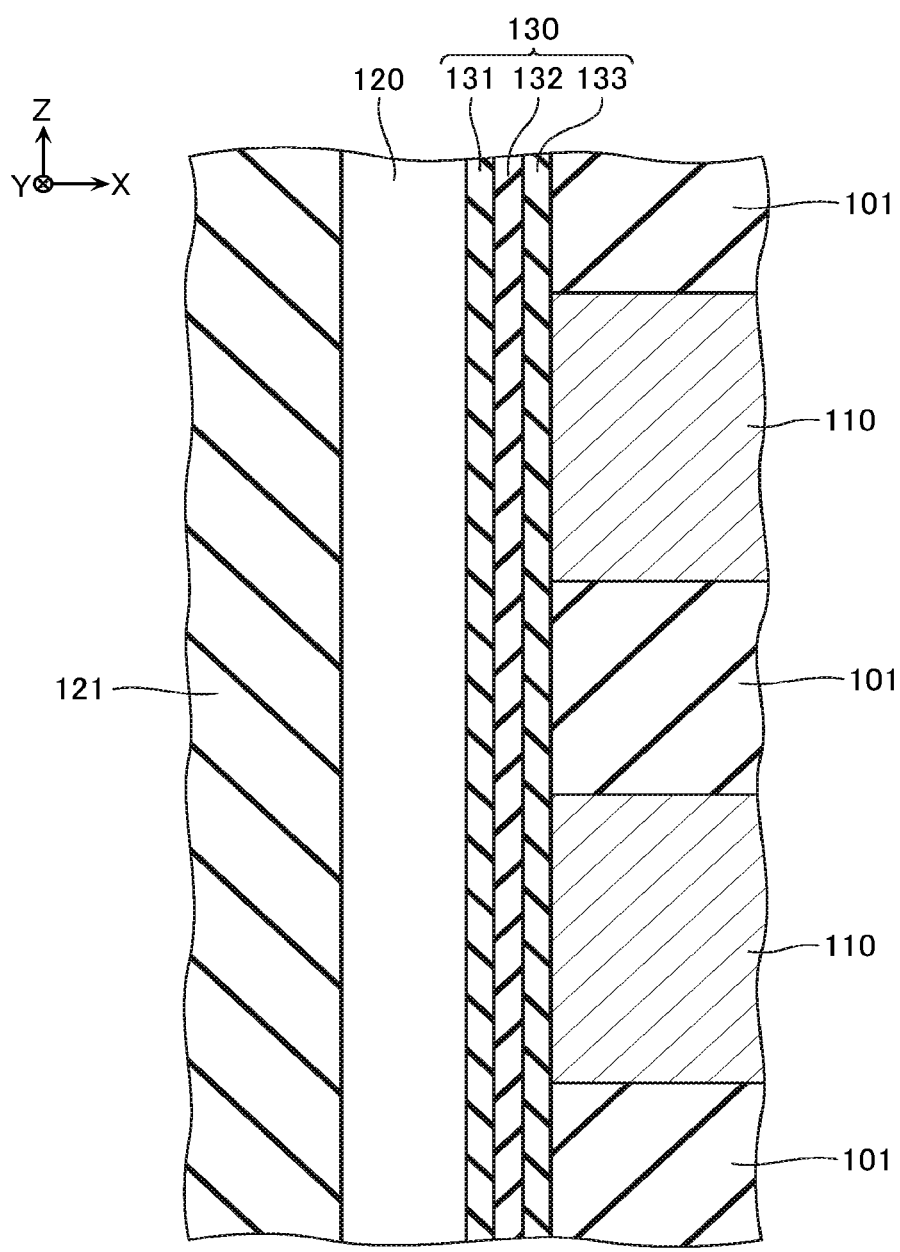
FIG. 6 is a schematic enlarged view of a part indicated by A in FIG. 5.

Next, with reference to FIG. 5 and FIG. 6, an exemplary configuration of the semiconductor memory device according to the embodiment is described. FIG. 5 is a schematic perspective view illustrating a configuration of a part of the semiconductor memory device according to the embodiment. FIG. 6 is a schematic enlarged view of a part indicated by A in FIG. 5.

As illustrated in FIG. 5, the semiconductor memory device according to the embodiment includes a semiconductor substrate 100, a plurality of conducting layers 110 provided above the semiconductor substrate 100, a plurality of semiconductor layers 120, a plurality of gate insulating films 130 provided between the plurality of conducting layers 110 and the plurality of semiconductor layers 120 respectively, a conducting layer 140 connected to a surface of the semiconductor substrate 100, and conducting layers 150 connected to upper ends of the semiconductor layers 120.

The semiconductor substrate 100 is, for example, a semiconductor substrate of single-crystal silicon (Si) or the like containing P-type impurities such as boron (B). The semiconductor substrate 100 includes a P-type well and an N-type well. The P-type well contains P-type impurities such as boron (B) and provided at a part of the surface of the semiconductor substrate 100. The N-type well contains N-type impurities such as phosphorus (P) and provided below the P-type well.

The conducting layer 110 is an approximately plate-shaped conducting layer extending in the X direction. The plurality of conducting layers 110 are arranged in the Z direction. The conducting layer 110, for example, may include a laminated film or the like of titanium nitride (TiN) and tungsten (W) or may contain polycrystalline silicon or the like containing impurities of phosphorus, boron, or the like. An insulating layer 101 of silicon oxide ($SiO_2$) or the like is provided between the conducting layers 110.

Among the plurality of conducting layers 110, one or a plurality of conducting layers 110 positioned below the other conducting layers 110 function as the source select line SGS (FIG. 2) and the gate electrodes of the plurality of source select transistors STS connected to this source select line SGS. A plurality of conducting layers 110 positioned above this function as the word lines WL (FIG. 2) and the gate electrodes of the plurality of memory cells MC (FIG. 2) connected to the word lines WL. One or a plurality of conducting layers 110 positioned above this function as the drain select line SGD and the gate electrodes of the plurality of drain select transistors STD (FIG. 2) connected to this drain select line SGD. The conducting layers 110 functioning as the drain select line SGD are separated in the Y direction via an insulating layer SHE extending in the X direction.

The plurality of semiconductor layers 120 are arranged in the X direction and the Y direction. The semiconductor layer 120 is, for example, a semiconductor film of non-doped polycrystalline silicon (Si) or the like. The semiconductor layer 120 has an approximately cylindrical shape and an insulating film 121 of silicon oxide or the like is provided at the center part of the semiconductor layer 120. Respective outer peripheral surfaces of the semiconductor layers 120 are surrounded by the conducting layers 110. The semiconductor layer 120 has a lower end portion connected to the P-type well of the semiconductor substrate 100 via a semiconductor layer 122 of non-doped single-crystal silicon or the like. The semiconductor layer 122 is opposed to the conducting layer 110 via an insulating layer 123 of silicon oxide or the like. The semiconductor layer 120 has an upper end portion connected to the bit line BL via a semiconductor layer 124 containing N-type impurities of phosphorus (P) or the like and contacts Ch and Cb. The respective semiconductor layers 120 function as channel regions of the plurality of memory cells MC and the drain select transistor STD included in one memory string MS (FIG. 2). The semiconductor layer 122 functions as a channel region of a part of the source select transistor STS.

The gate insulating film 130 includes, for example, as illustrated in FIG. 6, a tunnel insulating film 131, an electric charge accumulating film 132, and a block insulating film 133, which are laminated between the semiconductor layer 120 and the conducting layers 110. The tunnel insulating film 131 and the block insulating film 133 are, for example, insulating films of silicon oxide or the like. The electric charge accumulating film 132 is, for example, a film configured to accumulate the electric charge of silicon nitride (SiN) or the like. The tunnel insulating film 131, the electric charge accumulating film 132, and the block insulating film 133, which have approximately cylindrical shapes, extend in the Z direction along the outer peripheral surface of the semiconductor layer 120.

FIG. 6 illustrates an example that the gate insulating film 130 includes the electric charge accumulating film 132 of silicon nitride or the like. However, the gate insulating film 130 may include, for example, a floating gate of polycrystalline silicon or the like containing N-type or P-type impurities.

The conducting layer 140 is, as illustrated in FIG. 5, for example, an approximately plate-shaped conducting layer extending in the X direction and the Z direction. The conducting layer 140, for example, may include a laminated film or the like of titanium nitride (TiN) and tungsten (W) or may contain polycrystalline silicon or the like containing impurities such as phosphorus. Between the conducting layer 140 and the conducting layer 110, an insulating layer 141 is provided. The conducting layer 140 functions as the source line SL.

The plurality of conducting layers 150 extend in the Y direction and are arranged in the X direction. The conducting layer 150 may include a laminated film or the like of titanium nitride (TiN) and copper (Cu) or may contain polycrystalline silicon or the like containing impurities such as phosphorus. The conducting layer 150 functions as the bit line BL.

[Read Operation]

Figure 7:
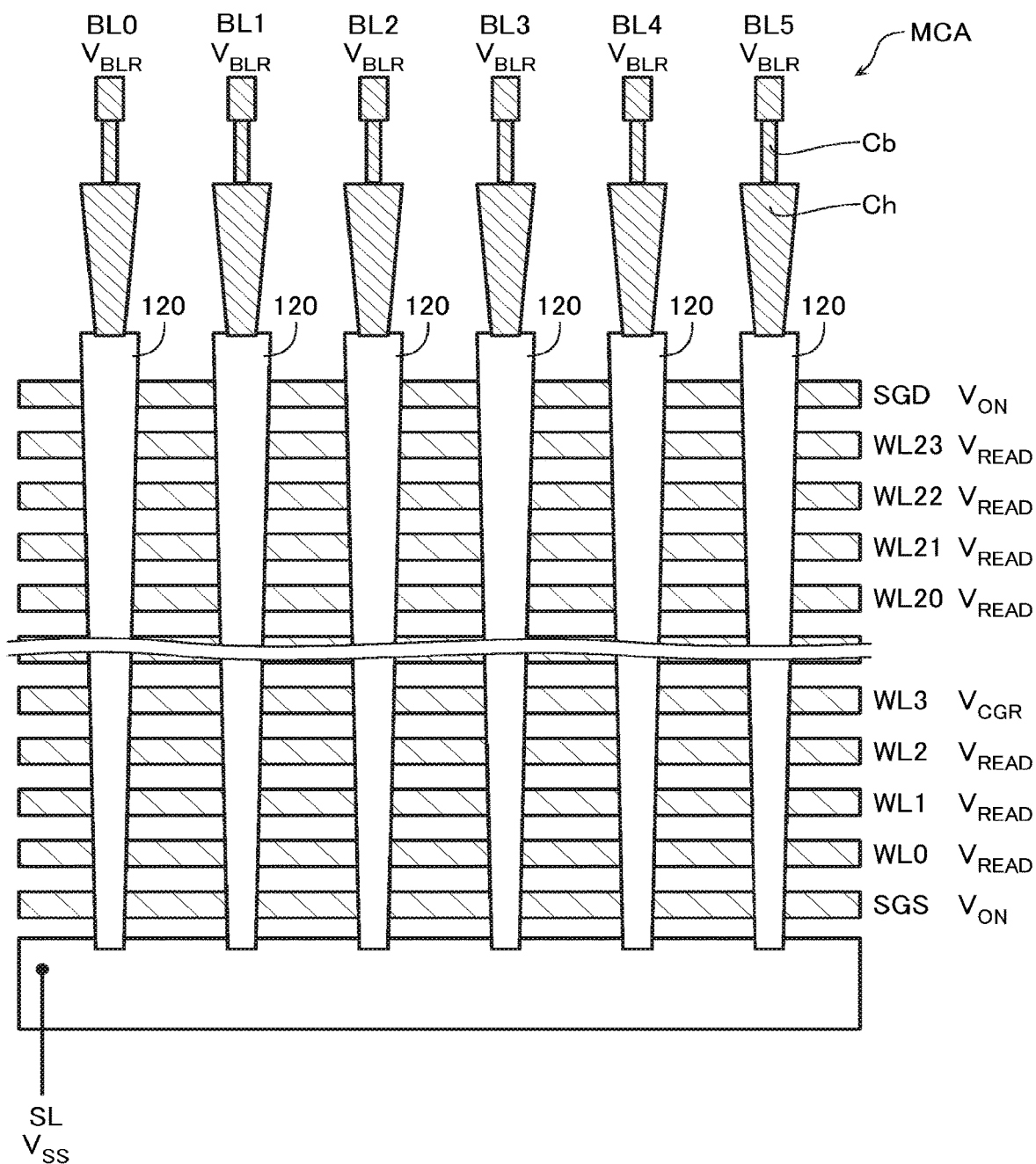
FIG. 7 is a schematic cross-sectional view for describing a read operation.

Next, with reference to FIG. 7, the read operation of the semiconductor memory device according to the embodiment is described. FIG. 7 is a schematic cross-sectional view for describing the read operation.

In the following description, the plurality of word lines WL are exemplified as word lines WL0 to WL23. The word line closest to the source select line SGS is the word line WL0, and the word line closest to the drain select line SGD is the word line WL23. In the following description, the plurality of bit lines BL are exemplified as bit lines BL0 to BL5. In the following description, the plurality of memory cells MC connected to the word line WL3 are exemplified as a selected memory cell MC.

In the read operation, for example, "1" is latched in all the data latches SDL (FIG. 3) included in the sense amplifier module SAM. This turns the nodes LAT (FIG. 4) in all the data latches SDL into an "H" state. This turns ON the charge transistor 37 and turns OFF the discharge transistor 38.

For example, the sequencer SQC supplies a control signal so as to turn ON the high withstand voltage transistor 31, the clamp transistor 32, the charge transistor 36, and the charge transistor 39, and turn OFF the discharge transistor 33. This charges the bit line BL and the sense node SEN via the power voltage supply line $V_{DD}$, and as illustrated in FIG. 7, a predetermined read bit line voltage $V_{BLR}$ is supplied to the bit line BL.

In the read operation, for example, the selected memory cell MC is caused to electrically conduct with the bit line BL and the source line SL. For example, an ON voltage $V_{ON}$ is supplied to the drain select line SGD and the source select line SGS. For example, the ON voltage $V_{ON}$ has a magnitude to the extent that electron channels are formed in the channel regions of the drain select transistor STD and the source select transistor STS and the drain select transistor STD and the source select transistor STS turn ON. A read pass voltage $V_{READ}$ is supplied to the non-selected word lines WL0 to WL2 and WL4 to WL23 (hereinafter simply described as "non-selected word lines WL" in some cases). For example, the read pass voltage $V_{READ}$ has a magnitude to the extent that the memory cell MC turns ON regardless of the data stored in the memory cell MC.

In the read operation, for example, the selected word line WL3 is supplied with a read voltage $V_{CGR}$. For example, the read voltage $V_{CGR}$ has a magnitude to the extent that the memory cell MC turns ON or turns OFF according to the data stored in the selected memory cell MC. The read voltage $V_{CGR}$ is smaller than the read pass voltage $V_{READ}$.

In the read operation, for example, the source line SL is supplied with the ground voltage $V_{SS}$.

This allows determining the data stored in the memory cell MC based on a current flowing through the bit line BL.

For example, the sequencer SQC supplies a control signal so as to turn OFF the charge transistor 39 and turn ON the discharge transistor 33 exemplified in FIG. 4. This decreases the voltage of the sense node SEN connected to the memory cell MC in the ON state, and the sense transistor 35 corresponding to this sense node SEN turns OFF. On the other hand, the voltage of the sense node SEN connected to the memory cell MC in the OFF state does not significantly decrease, and the sense transistor 35 corresponding to this sense node SEN turns ON.

Next, for example, the sequencer SQC supplies a control signal so as to turn ON the switch transistor 34. In this respect, the electric charge in the wiring LBUS connected to the memory cell MC in the ON state is maintained, and the voltage of this wiring LBUS does not significantly decrease.

On the other hand, the electric charge in the wiring LBUS connected to the memory cell MC in the OFF state are discharged via the sense transistor 35 and the voltage of this wiring LBUS decreases.

Next, for example, the sequencer SQC supplies a control signal so as to turn ON the switch transistor 43. In this respect, the voltage of the node LAT connected to the memory cell MC in the ON state does not significantly decrease, and the node LAT is maintained in the "H" state. On the other hand, the voltage of the node LAT connected to the memory cell MC in the OFF state decreases, and the node LAT turns into the "L" state. Thus, the data latches SDL each obtain one-bit data indicative of whether the memory cell MC is in the ON state or the OFF state. This data is, for example, transferred to the data latch XDL.

[Write Operation]

Figure 8:
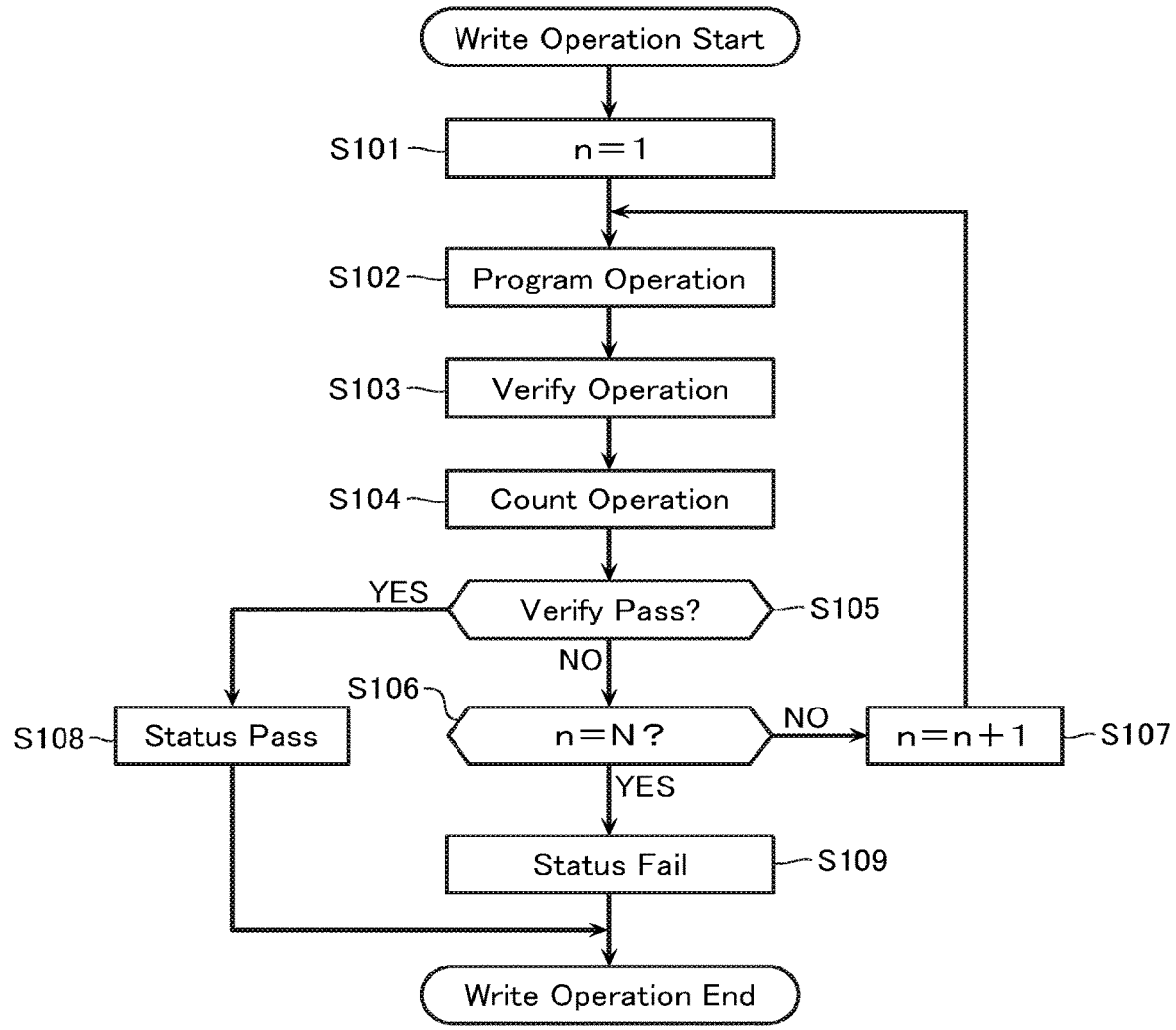
FIG. 8 is a schematic flowchart for describing a write operation.
Figure 9:
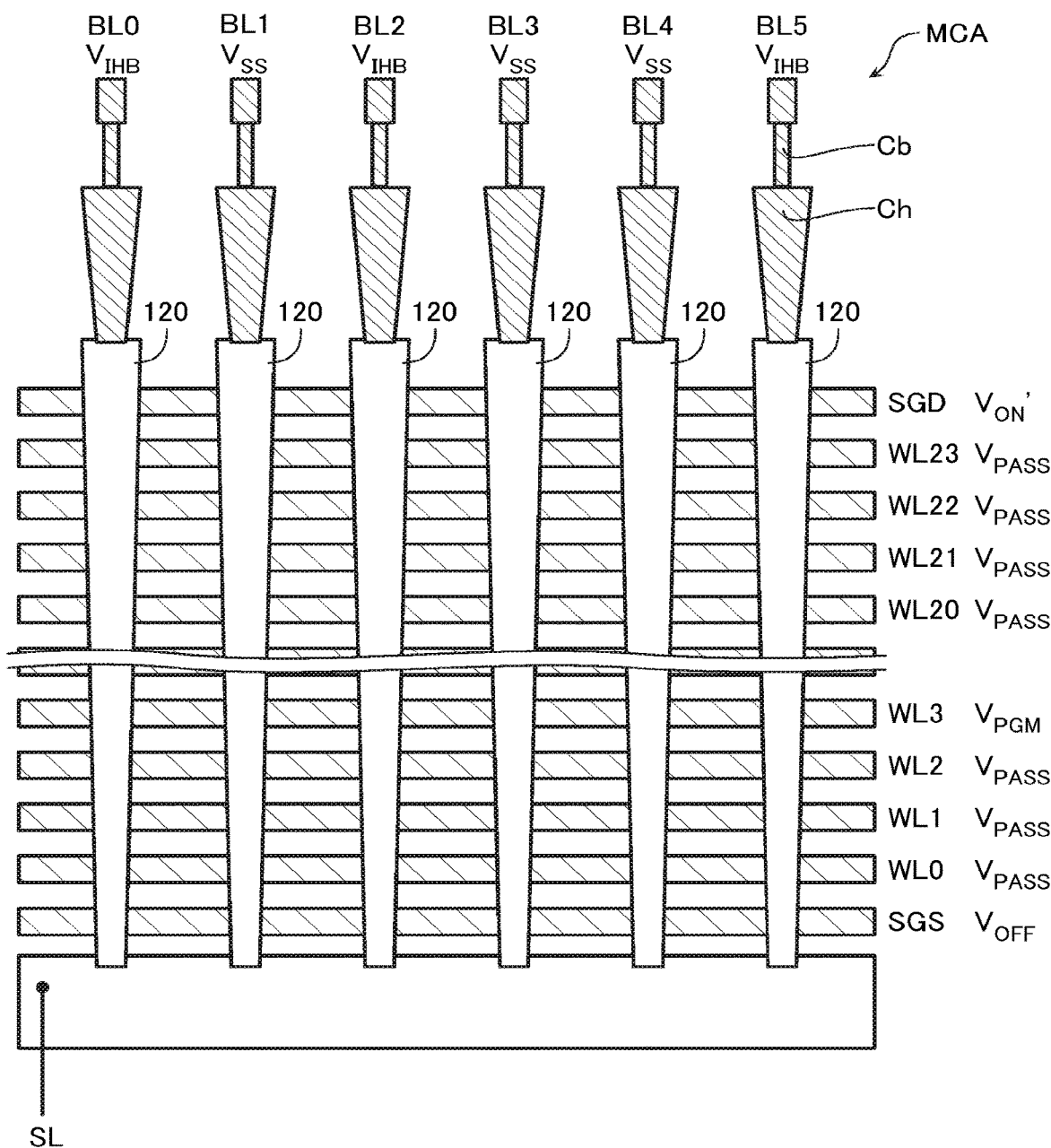
FIG. 9 is a schematic cross-sectional view for describing the write operation.
Figure 10:
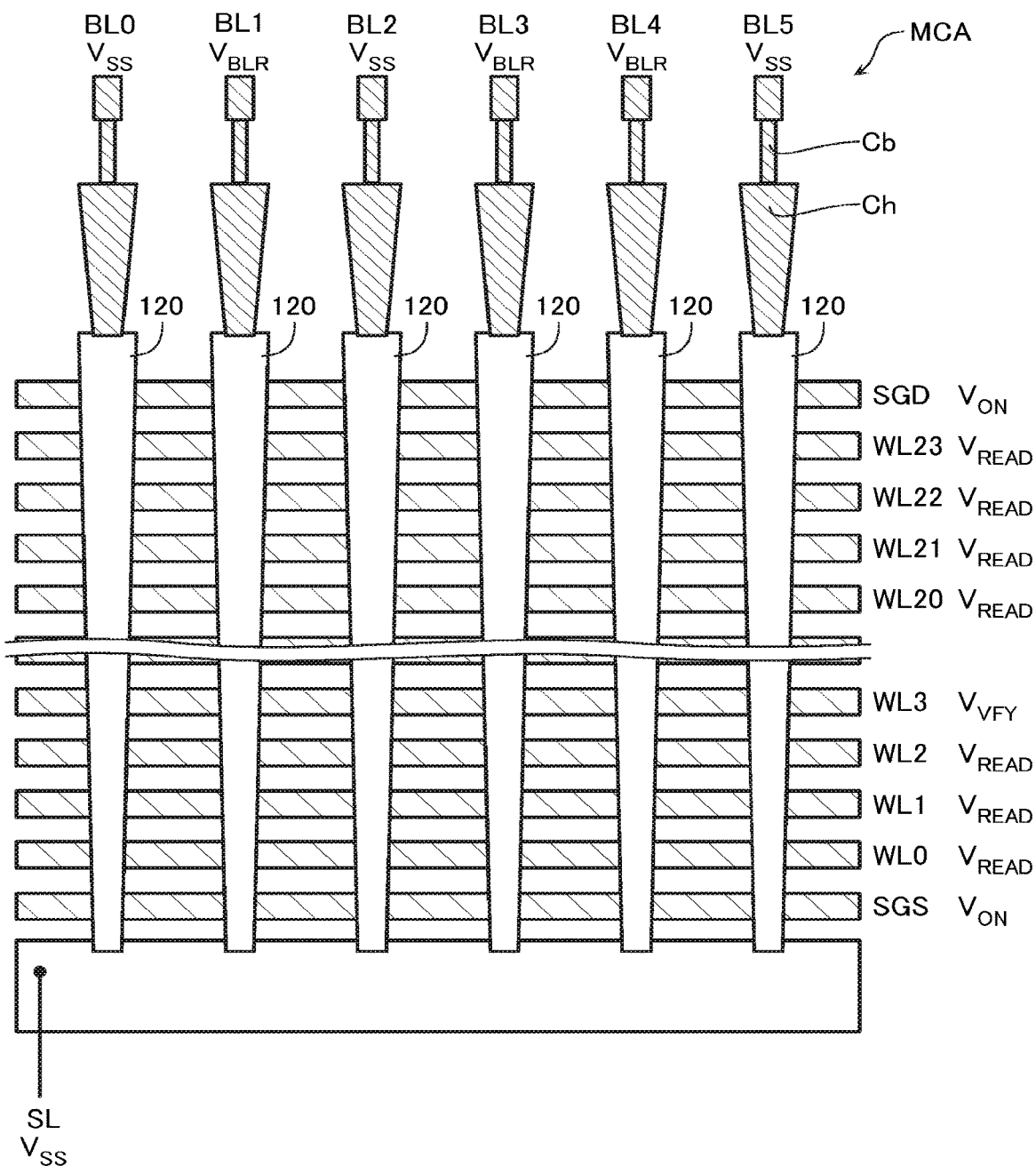
FIG. 10 is a schematic cross-sectional view for describing the write operation.

Next, with reference to FIG. 8 to FIG. 10, the write operation of the semiconductor memory device according to the embodiment is described. FIG. 8 is a schematic flowchart for describing the write operation. FIG. 9 and FIG. 10 are schematic cross-sectional views for describing the write operation.

In the write operation, threshold voltages of some memory cells MC among the plurality of selected memory cells MC are adjusted and threshold voltages of the other memory cells MC are not adjusted. Hereinafter, among the selected memory cells MC, the selected memory cell MC whose threshold voltage is adjusted may be referred to as "write memory cell MC" and the selected memory cell MC whose threshold voltage is not adjusted may be referred to as "inhibited memory cell MC."

At Step S101, a loop count n is set to 19. The loop count n is latched in a register or the like. The data latch SDL (FIG. 4) in the sense amplifier unit SAU corresponding to the bit line BL connected to the write memory cell MC is caused to latch "0" ("L"). The data latch SDL in the sense amplifier unit SAU corresponding to the bit line BL connected to the inhibited memory cell MC is caused to latch "1" ("H").

At Step S102, a program operation is performed. In the program operation, the memory cell MC and the like is provided with a voltage by an aspect exemplified in, for example, FIG. 9. For example, the sequencer SQC supplies a control signal so as to turn ON the high withstand voltage transistor 31, the clamp transistor 32, and the charge transistor 36, and turn OFF the discharge transistor 33 and the charge transistor 39 exemplified in FIG. 4.

Thus, regarding the write memory cell MC, since the data latch SDL in the corresponding sense amplifier unit SAU latches "0" ("L"), the charge transistor 37 turns OFF and the discharge transistor 38 turns ON. Therefore, the bit line BL electrically conducts with the voltage supply line $V_{SRC}$ and a voltage around the ground voltage $V_{SS}$ is supplied to the bit lines BL. Meanwhile, regarding the inhibited memory cell MC, since the data latch SDL in the corresponding sense amplifier unit SAU latches "1" ("H"), the charge transistor 37 turns ON and the discharge transistor 38 turns OFF. Therefore, the bit line BL electrically conducts with the power voltage supply line $V_{DD}$ and a write inhibit voltage $V_{IHB}$ is supplied to the bit line BL. The write inhibit voltage $V_{IHB}$ is, for example, larger than the ground voltages $V_{SS}$.

In the program operation, the write memory cell MC is caused to electrically conduct with the bit line BL selectively. For example, an ON voltage $V_{ON}'$ is supplied to the drain select line SGD. For example, the ON voltage $V_{ON}'$ has a magnitude to the extent that the drain select transistor STD connected to the bit line BL to which the ground voltage $V_{SS}$ is supplied turns ON and the drain select transistor STD connected to the bit line BL to which the write inhibit voltage $V_{IHB}$ is supplied turns OFF. An OFF voltage $V_{OFF}$ is supplied to the source select line SGS. For example, the OFF voltage $V_{OFF}$ has a magnitude to the extent that the drain select transistor STD and the source select transistor STS turn OFF. A write pass voltage $V_{PASS}$ is supplied to the non-selected word line WL. For example, the write pass voltage $V_{PASS}$ has a magnitude to the extent that the memory cell MC turns ON regardless of the data stored in the memory cell MC. The write pass voltage $V_{PASS}$ is, for example, larger than the read pass voltage $V_{READ}$.

A program voltage $V_{PGM}$ is supplied to the selected word line WL3. The program voltage $V_{PGM}$ is larger than the write pass voltage $V_{PASS}$. This accumulates the electrons on the electric charge accumulating film 132 (FIG. 6) in the write memory cell MC, thus increasing the threshold voltage of the write memory cell MC.

At Step S103 (FIG. 8) a verify operation is performed. In the verify operation, the memory cell MC and the like is provided with a voltage similarly to the example described with reference to FIG. 10.

The verify operation is performed basically similar to the read operation. However, while all the data latches SDL included in the sense amplifier module SAM are caused to latch "1" ("H") in the read operation, only the data latches SDL corresponding to the target memory cells MC are caused to latch "1" ("H") and the data latches SDL corresponding to the memory cells MC out of the target to latch "0" ("L") in the verify operation. Specifically, in the verify operation, only the data latch SDL corresponding to the write memory cell MC in the program operation which is target for validation is caused to latch "1" ("H") and the data latch SDL corresponding to the inhibited memory cell MC is caused to latch "0" ("L"). Accordingly, while the predetermined read bit line voltage $V_{BLR}$ is supplied to the bit line BL corresponding to the write memory cell MC, the voltage around the ground voltage $V_{SS}$ is supplied to the bit line BL corresponding to the inhibited memory cell MC via the voltage supply line $V_{SRC}$ (FIG. 4). For example, data latched in another data latch such as the data latch ADL (an operation is appropriately performed as necessary) is transferred to the data latch SDL to allow the data latch SDL included in the sense amplifier module SAM to latch "1" ("H") or "0" ("L") according to the program operation target for validation.

The selected memory cell MC is caused to electrically conduct with the bit line BL and the source line SL.

A verify voltage $V_{VFY}$ is supplied to the selected word line WL3. For example, the verify voltage $V_{VFY}$ has a magnitude to the extent that the memory cell MC turns ON or turns OFF according to the data stored in the selected memory cell MC. The verify voltage $V_{VFY}$ is larger than the read voltage $V_{CGR}$.

The ground voltage $V_{SS}$ is supplied to the source line SL.

Accordingly, regarding the write memory cell MC in the program operation target for validation, whether the memory cell MC is in the ON state or the OFF state can be determined based on the current of the bit line BL connected to the memory cell MC by the corresponding sense amplifier unit SAU. For example, the node LAT in the data latch SDL connected to the write memory cell MC in the OFF state turns into the "L" state, and this write memory cell MC is treated as the inhibited memory cell MC in the subsequent processes in the write operation. Then, based on the data in the data latch SDL, the data latched in another data latch such as the data latch ADL is appropriately updated. The data in the data latch SDL is transferred to the data latch XDL.

At Step S104 (FIG. 8), a count operation is performed. In the count operation, for example, the number of memory cells MC in the ON state is counted based on the data latched cells MC in the data latch XDL in the sense amplifier module SAM (FIG. 3). In the count operation, sampling of the memory cells MC can be performed. That is, the number of memory cells MC in the ON state can be counted, not based on the data latched in all the data latches XDL included in the sense amplifier module SAM, but based on only the data latched in some of the data latches XDL.

At Step S105, for example, whether the number of memory cells MC in the ON state counted in the count operation is equal to or less than a predetermined count is determined. If the number of memory cells MC is not equal to or less than the predetermined count, the process proceeds to Step S106. If the number of memory cells MC is equal to or less than the predetermined count, the process proceeds to Step S108.

At Step S106, whether the loop count n has reached a predetermined count N or not is determined. If the loop count n does not reach the predetermined count N, the process proceeds to Step S107. If the loop count n reaches the predetermined count N, the process proceeds to Step S109.

At Step S107, 1 is added to the loop count n, the program voltage $V_{PGM}$ is increased, and the process proceeds to Step S102.

At Step S108, the status data indicative of normal termination of the write operation is output and the write operation is terminated.

At Step S109, the status data indicative of failure of normal termination of the write operation is output and the write operation is terminated.

[Erase Operation]

Figure 11:
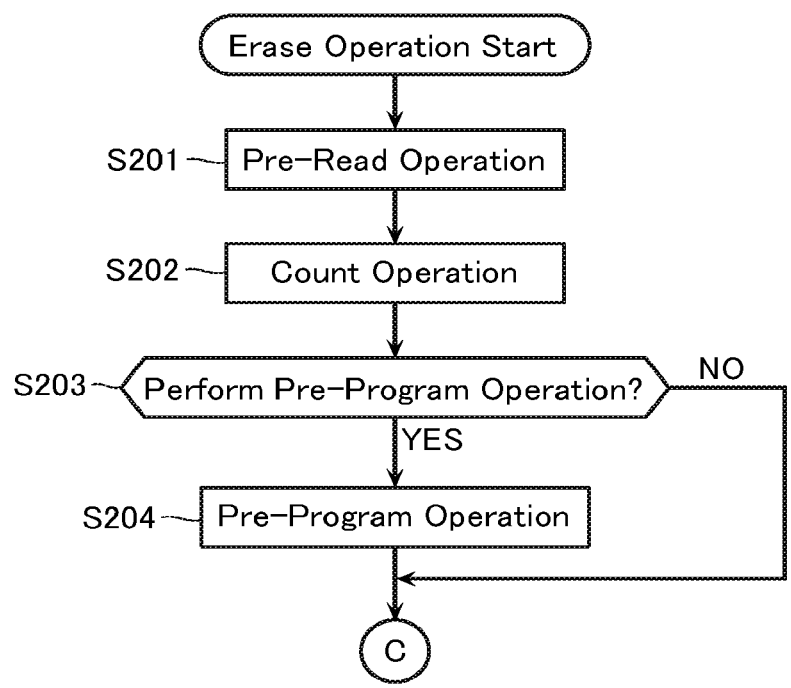
FIG. 11 is a schematic flowchart for describing an erase operation.
Figure 12:
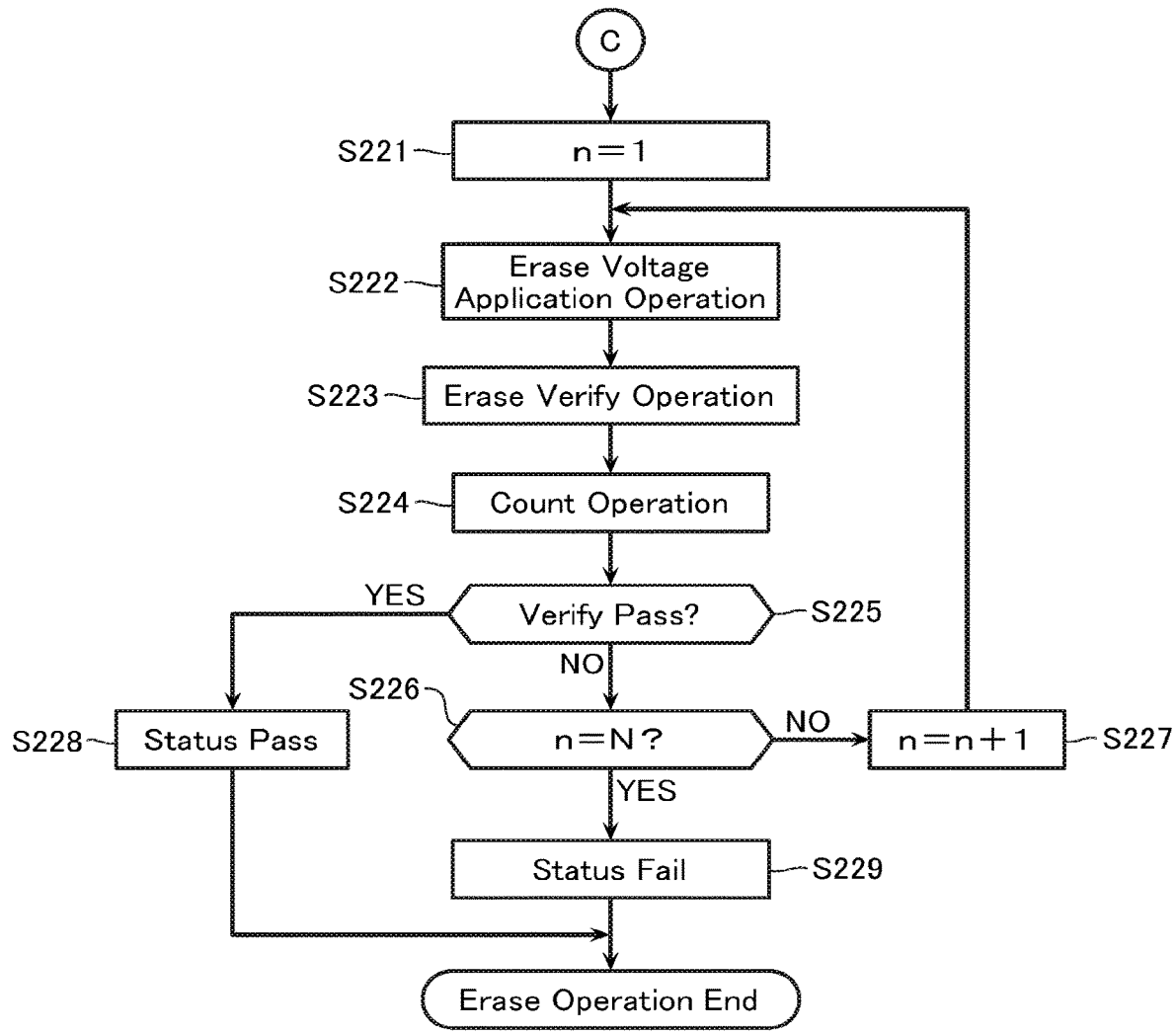
FIG. 12 is a schematic flowchart for describing the erase operation.
Figure 13:
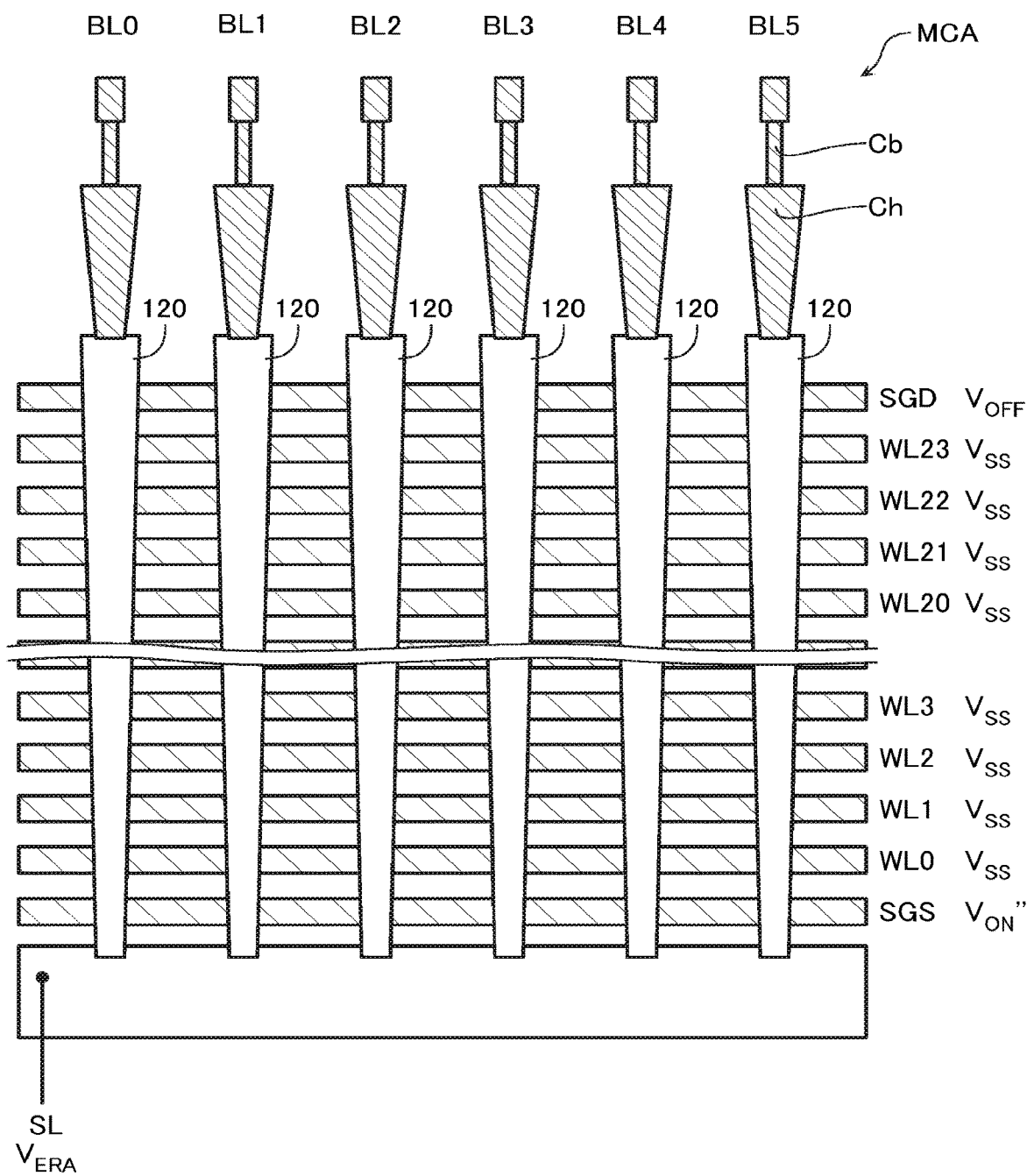
FIG. 13 is a schematic cross-sectional view for describing the erase operation.

Next, with reference to FIG. 11 to FIG. 13, the erase operation of the semiconductor memory device according to the embodiment is described. FIG. 11 and FIG. 12 are schematic flowcharts for describing the erase operation. FIG. 13 is a schematic cross-sectional view for describing the erase operation.

At Step S201 (FIG. 11), a pre-read operation is performed. The pre-read operation is basically performed similarly to the read operation. Details of the pre-read operation will be described later.

At Step S202, the count operation is performed. In the count operation, for example, the number of memory cells MC in the ON state is counted based on the data latched in the data latch XDL in the sense amplifier module SAM (FIG. 3). In the count operation, sampling of the memory cells MC may be performed.

At Step S203, for example, whether the number of memory cells MC in the ON state counted in the count operation is equal to or less than a predetermined count is determined. If the number of memory cells MC is not equal to or less than the predetermined count, the process proceeds to Step S204. If the number of memory cells MC is equal to or less than the predetermined count, the process proceeds to Step S221.

At Step S204, a pre-program operation is performed. The pre-program operation is, for example, performed similarly to the program operation (FIG. 8, FIG. 9) in the write operation.

The operations from Step S201 to Step S204 may be performed only once corresponding to one word line WL3 or may be repeatedly performed multiple times by sequentially selecting the plurality of word lines WL. In the pre-program operation, one word line WL may be selected as the selected word line and supply the selected word line with the program voltage or may supply all the word lines WL with the program voltage.

At Step S221 (FIG. 12), the loop count n is set to 1. The loop count n is latched in the register or the like.

At Step S222, an erase voltage application operation is performed. In the erase voltage application operation, the memory cells MC and the like are supplied with a voltage by, for example, an aspect exemplified in FIG. 13.

For example, in the erase voltage application operation, the source line SL is supplied with an erase voltage $V_{ERA}$. The erase voltage $V_{ERA}$ is larger than the write pass voltage $V_{PASS}$.

For example, in the erase voltage application operation, the drain select line SGD is supplied with the OFF voltage $V_{OFF}$ and the source select line SGS is supplied with an ON voltage $V_{ON}''$. The ON voltage $V_{ON}''$, for example, has a magnitude to the extent that the hole channels are formed in the channel region in the source select transistor STS and the source select transistor STS turns ON.

For example, in the erase voltage application operation, all the word lines WL are supplied with the ground voltage $V_{SS}$. This accumulates the holes in the electric charge accumulating film 132 (FIG. 6) in the memory cell MC and the threshold voltage of the memory cell MC decreases.

At Step S223 (FIG. 12), an erase verify operation is performed. The erase verify operation in the erase operation is basically performed similarly to the verify operation in the write operation. Details of the erase verify operation will be described later.

At Step S224, the count operation is performed. In the count operation, for example, the number of memory cells MC in the OFF state is counted based on the data latched in the data latch XDL in the sense amplifier module SAM (FIG. 3). In the count operation, sampling of the memory cells MC may be performed.

At Step S225, for example, whether the number of memory cells MC in the OFF state counted in the count operation is equal to or less than a predetermined count is determined. If the number of memory cells MC is not equal to or less than the predetermined count, the process proceeds to Step S226. If the number of memory cells MC is equal to or less than the predetermined count, the process proceeds to Step S228.

At Step S226, whether the loop count n has reached a predetermined count N or not is determined. If the loop count n does not reach the predetermined count N, the process proceeds to Step S227. If the loop count n reaches the predetermined count N, the process proceeds to Step S229.

At Step S227, 1 is added to the loop count n, the erase voltage $V_{ERA}$ is increased, and the process proceeds to Step S222.

At Step S228, the status data indicative of normal termination of the erase operation is output and the erase operation is terminated.

At Step S229, the status data indicative of failure of the normal termination of the erase operation is output and the erase operation is terminated.

[Pre-Read Operation and Erase Verify Operation]

As described above, in the erase operation according to the embodiment, the pre-read operation (Step S201 of FIG. 11) is performed before the erase voltage application operation (Step S222 of FIG. 12) and the pre-program operation (Step S204 of FIG. 11) is performed when the number of memory cells MC in the ON state is equal to or less than the predetermined count. This allows reducing the additional erase voltage application operation on the memory cell MC in the erase state and reducing the excessively small threshold voltage of the memory cell MC.

Especially, when the program operation is performed on only some word lines WL included in the memory block MB, the memory cells MC connected to the remaining word lines WL are in the erase state. Performing the erase operation on such memory block MB possibly results in excessively small threshold voltages of the many memory cells MC. Therefore, for example, the pre-read operation is performed on the word lines WL whose execution orders of the write operation are late in the memory block MB and the program voltage is supplied to all the word lines WL in the memory cell array MCA in the pre-program operation in this embodiment. Therefore, the excessively small threshold voltages of the memory cells MC can be preferably reduced in the first embodiment.

In the erase operation according to the embodiment, the erase verify operation (Step S223 of FIG. 12) is performed after performing the erase voltage application operation (Step S222 of FIG. 12) and performs the erase voltage application operation again when the number of memory cells MC in the OFF state is not equal to or less than a predetermined count. This gradually adjusts the threshold voltages of the memory cells MC multiple times and allows preferably controlling a distribution of the threshold voltages of the memory cells MC.

Figure 14:
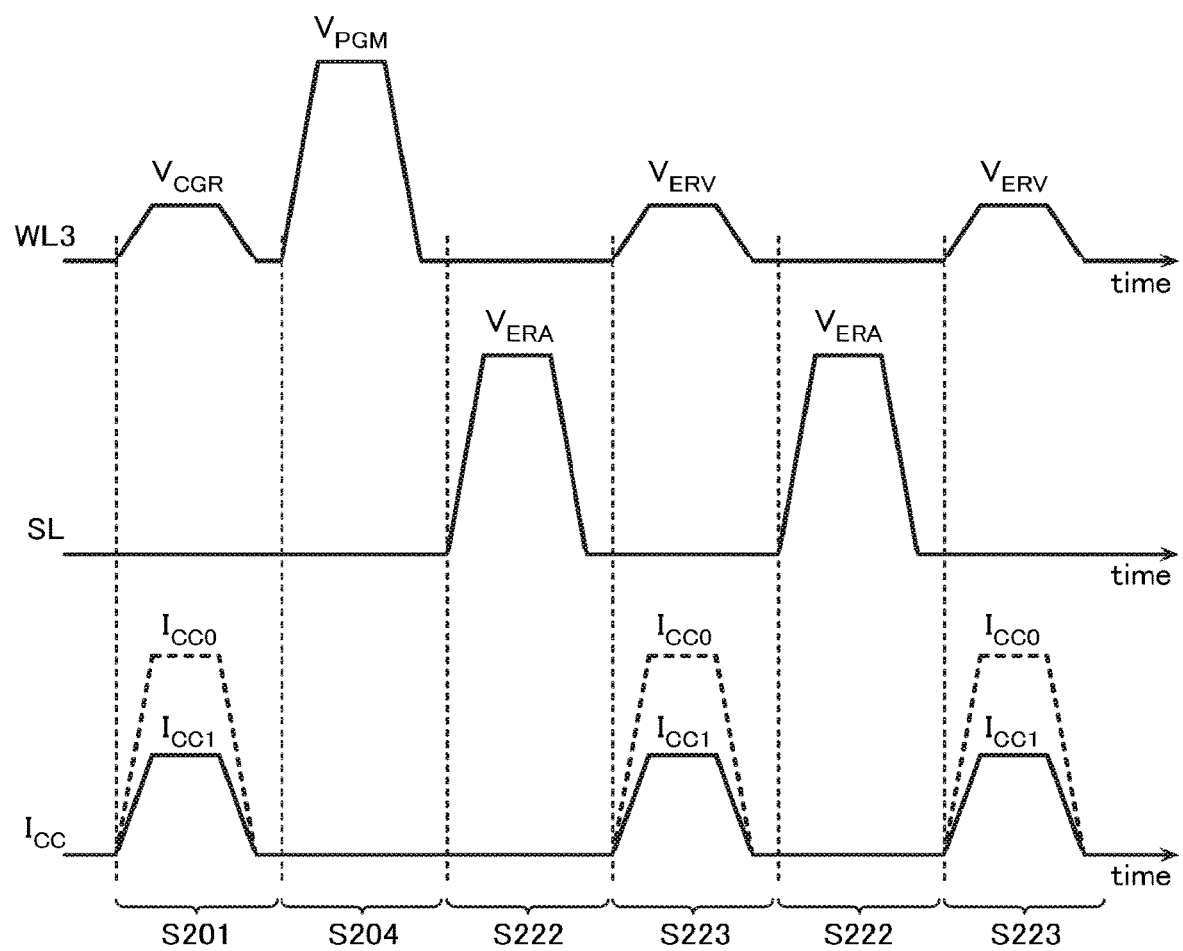
FIG. 14 is a schematic waveform diagram for describing the erase operation.

However, there may be a case where a total amount of current flowing through the plurality of memory cells MC becomes large in the pre-read operation and the erase verify operation. For example, FIG. 14 illustrates the voltage of the word line WL3, the voltage of the source line SL, and a power supply current $I_{CC}$ flowing through at least one of the power voltage supply line $V_{DD}$ and the ground voltage supply line in the erase operation. As illustrated in the drawing, in the pre-program operation (S204), the erase voltage application operation (S222), which control the threshold voltages of the memory cells MC, and the like, the currents hardly flow through the memory cells MC and the power supply currents $I_{CC}$ hardly flow as well. On the other hand, comparatively large currents flow through the plurality of memory cells MC in the pre-read operation (S201) and the erase verify operation (S223), in which the threshold voltages of the memory cells MC are confirmed, and therefore the power supply current $I_{CC}$ also becomes a comparatively large current $I_{CC0}$ as illustrated in FIG. 14 in some cases. This possibly results in an increase in peak current and increase in power consumption.

Here, the data obtained by the pre-read operation and the erase verify operation are not used for calculating the user data as in the read operation (FIG. 7) and are not used to change the write memory cell MC to the inhibited memory cell MC as in the verify operation (Step S103 of FIG. 8) in the write operation. The data obtained by the pre-read operation and the erase verify operation are used only for the subsequent count operations (Step S202 of FIG. 11 and Step S224 of FIG. 12). As described above, there may be cases where sampling of the memory cells MC is performed in these count operations. Accordingly, it is considered that even when sampling of the memory cells MC is performed in the pre-read operation and the erase verify operation, if the sampled memory cells MC correspond to the memory cells which are sampled in the count operations, this operation does not affect various determination operations.

Sampling the memory cells MC in the pre-read operation and the erase verify operation allows reducing the current flowing through the memory cells MC and setting the power supply current $I_{CC}$ to be a comparatively small current $I_{CC1}$ as illustrated in FIG. 14. This allows substantial reductions in peak current and power consumption.

Figure 15:
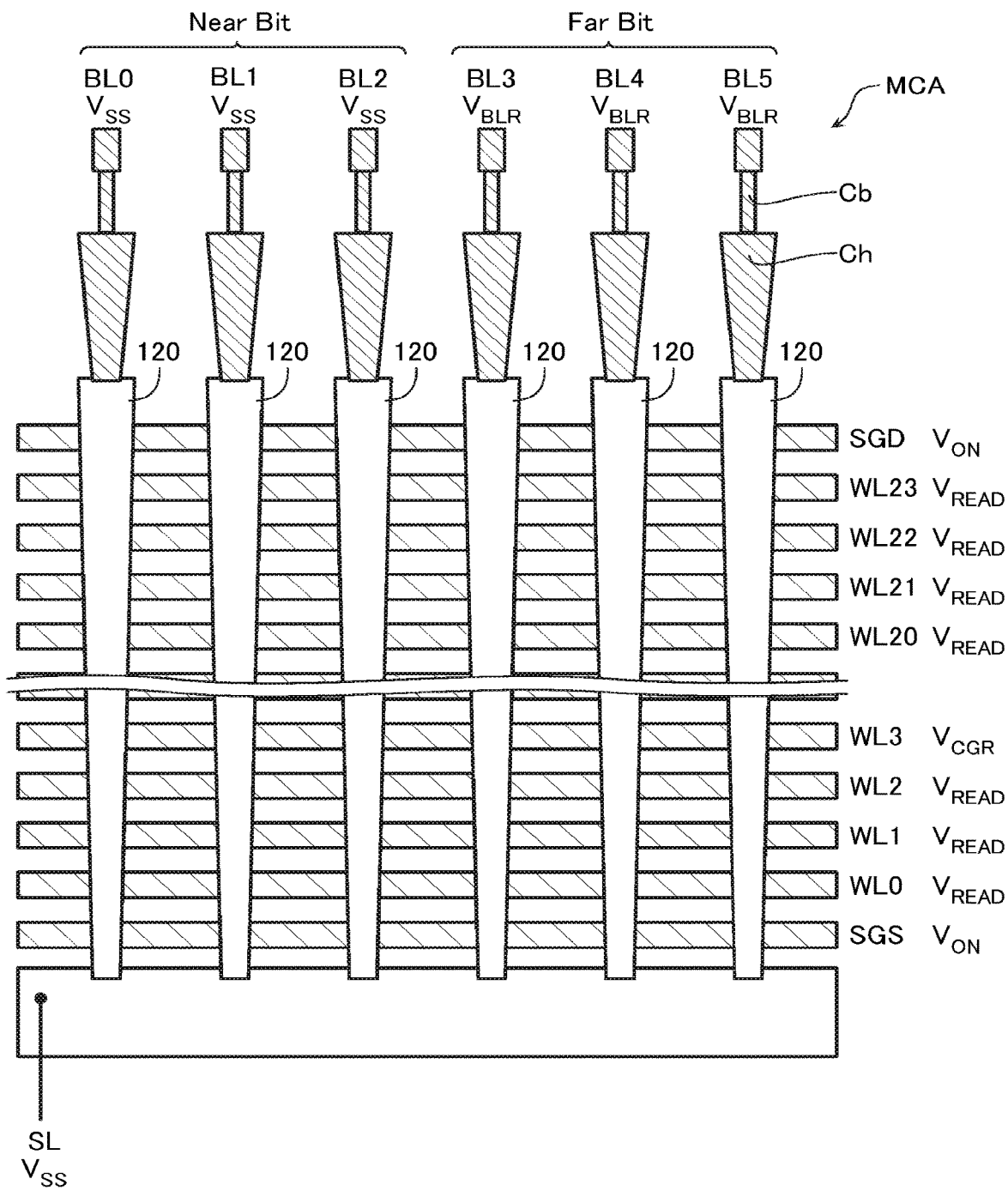
FIG. 15 is a schematic cross-sectional view for describing the erase operation.
Figure 16:
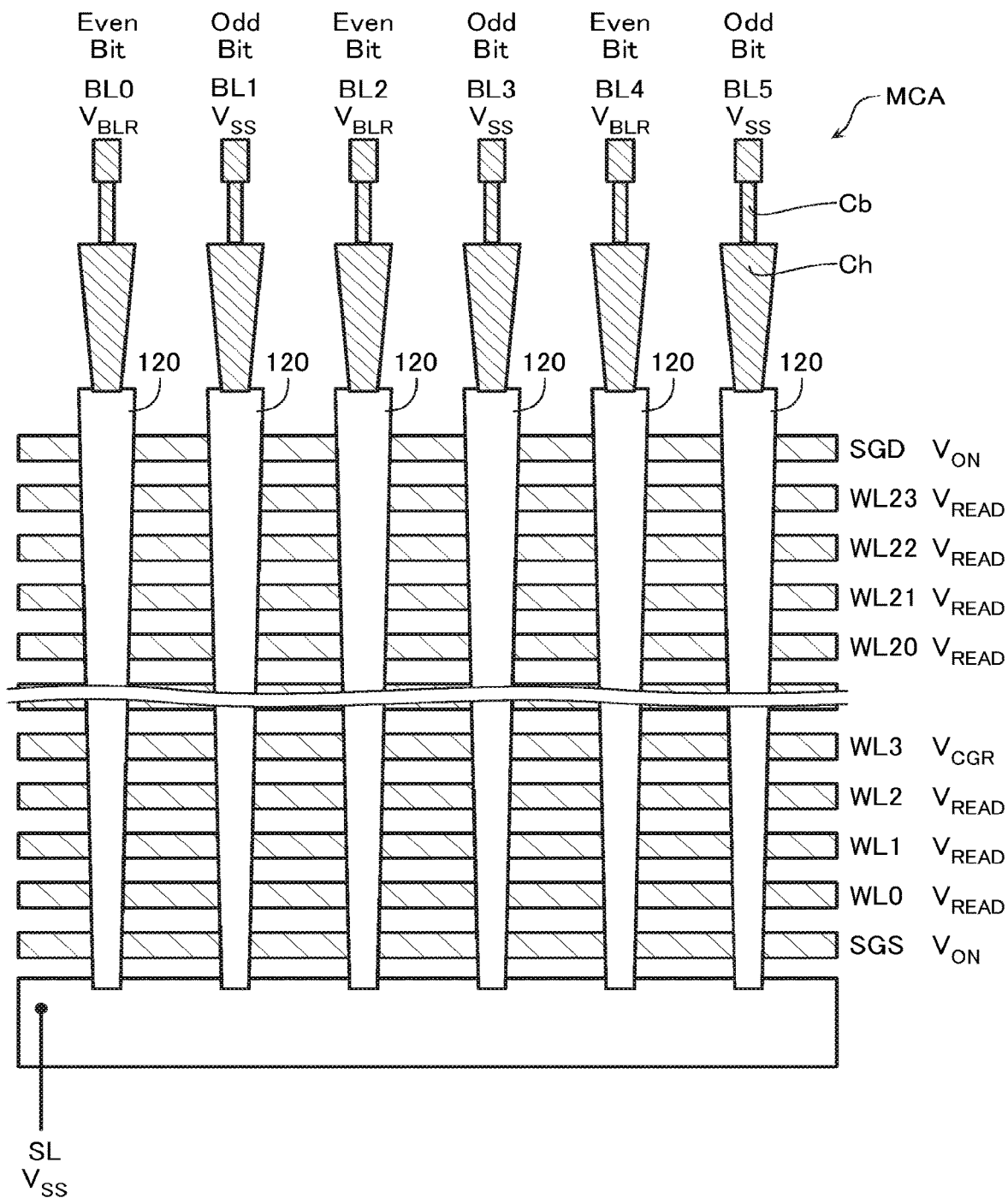
FIG. 16 is a schematic cross-sectional view for describing the erase operation.

Next, with reference to FIG. 15 and FIG. 16, the pre-read operation according to the embodiment is described. FIG. 15 and FIG. 16 are schematic cross-sectional views for describing the pre-read operation.

In the pre-read operation according to the embodiment, for example, "0" is latched in the data latch SDL corresponding to the memory cell MC which is not sampled and "1" is latched in the data latch SDL corresponding to the memory cell MC which is sampled among the plurality of data latches SDL (FIG. 3) included in the sense amplifier module SAM.

The sampled memory cells MC are selectable by various aspects. For example, as exemplified in FIG. 15, the memory cells MC corresponding to near bits (half the number of bits near to the row decoder RD (FIG. 1)) may be sampled or the memory cells MC corresponding to far bits (half the number of bits far from the row decoder RD (FIG. 1)) may be sampled. For example, as exemplified in FIG. 16, the memory cells MC corresponding to odd bits may be sampled or the memory cells MC corresponding to even bits may be sampled. Additionally, not thus sampling the half the number of memory cells MC among all the memory cells MC, but a quarter of the memory cells MC may be sampled, one-eighths of the memory cells MC may be sampled, or the memory cells MC may be sampled by another aspect. Note that the memory cells MC which are not sampled in the pre-read operation are preferably the memory cells MC unused for the count operation (Step S202 of FIG. 11). The memory cells MC which are not sampled in the pre-read operation may be, for example, all the memory cells MC unused for the count operation.

In the pre-read operation, the bit line BL, the source line SL, the word line WL, and the select gate lines (SGD, SGS) are supplied with voltages by an aspect approximately similar to the read operation described with reference to FIG. 7. However, to the bit line BL corresponding to the memory cells MC other than the sampled memory cell MC, a voltage around the ground voltage $V_{SS}$ is supplied via the voltage supply line $V_{SRC}$ (FIG. 4).

In the pre-read operation, the determination is performed based on the amount of the current flowing through the bit line BL.

In the embodiment, the pre-read operation is not performed on the memory cells MC other than the sampled memory cell MC in the one-time erase operation. That is, from when the start of the erase operation until the performing of the pre-program operation (Step S204 of FIG. 11) or the erase voltage application operation (Step S222 of FIG. 12), the pre-read operation is performed only on the sampled memory cells MC and the pre-read operation is not performed on the other memory cells MC.

The pre-read operation according to the embodiment is performed by an aspect approximately similar to the read operation described with reference to FIG. 7 and the memory cells MC are sampled. Accordingly, when the read operation and the pre-read operation are performed on the memory blocks having identical conditions, the power supply current $I_{CC}$ is assumed to decrease approximately directly proportional to the number of memory cells MC which are not sampled. For example, when the half the number of memory cells MC are sampled in the pre-read operation, the power supply current $I_{CC}$ in the pre-read operation is assumed to be approximately the half of the power supply current $I_{CC}$ in the read operation. It is considered that a difference in the power supply current $I_{CC}$ between the read operation and the pre-read operation can be confirmed by, for example, performing the read operation and the pre-read operation on the memory block MB in the erase state.

Figure 17:
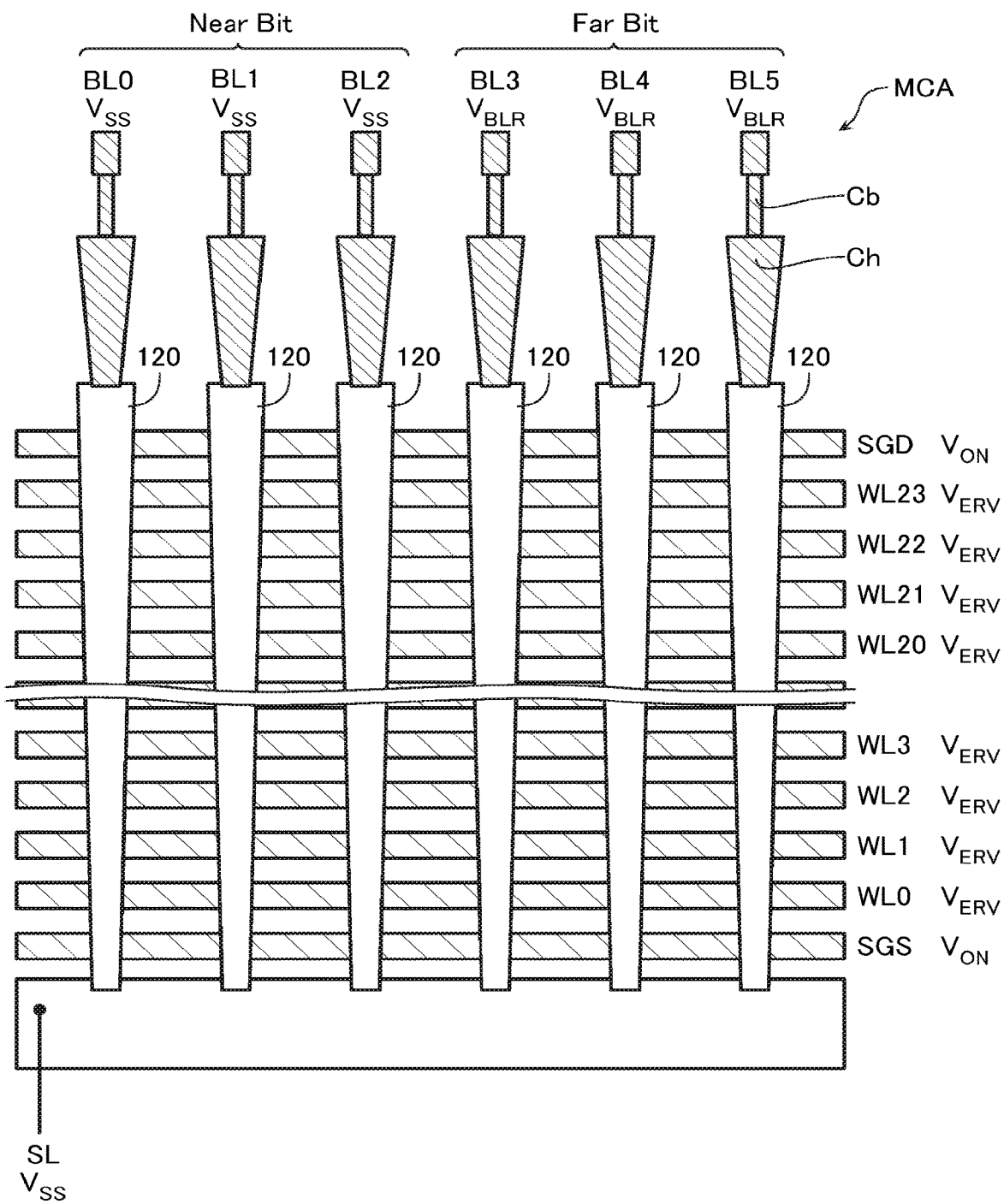
FIG. 17 is a schematic cross-sectional view for describing the erase operation.
Figure 18:
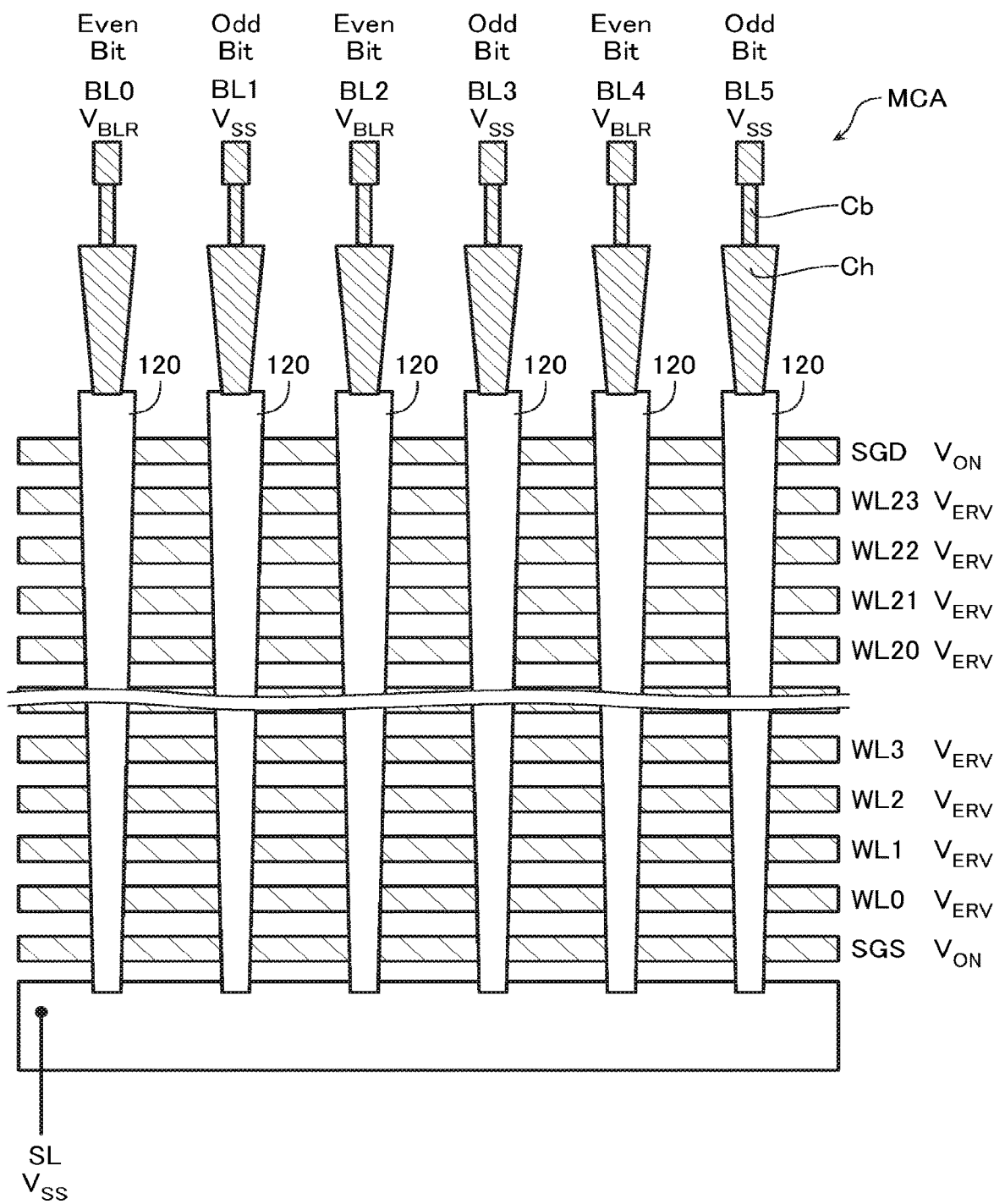
FIG. 18 is a schematic cross-sectional view for describing the erase operation.

Next, with reference to FIG. 17 and FIG. 18, the erase verify operation according to the embodiment is described. FIG. 17 and FIG. 18 are schematic cross-sectional views for describing the erase verify operation.

As illustrated in the drawings, the erase verify operation is basically performed similarly to the pre-read operation. However, in the erase verify operation, all the word lines WL0 to WL23 are supplied with erase verify voltages $V_{ERV}$. The erase verify voltage $V_{ERV}$, for example, may have a magnitude almost identical to that of the ground voltage $V_{SS}$.

The sampled memory cells MC are selectable by various aspects similarly to the pre-read operation. For example, as exemplified in FIG. 17, the memory cells MC corresponding to the near bits may be sampled or the memory cells MC corresponding to the far bits may be sampled. For example, as exemplified in FIG. 18, the memory cells MC corresponding to the odd bits may be sampled or the memory cells MC corresponding to the even bits may be sampled. Additionally, not thus sampling the half the number of memory cells MC among all the memory cells MC, but a quarter of the memory cells MC may be sampled, one-eighths of the memory cells MC may be sampled, or the memory cells MC may be sampled by another aspect. Note that the memory cells MC which are not sampled in the erase verify operation are preferably the memory cells MC unused for the count operation (Step S224 of FIG. 12). The memory cells MC which are not sampled in the erase verify operation may be, for example, all the memory cells MC unused for the count operation.

In the embodiment, the erase verify operation is not performed on the memory cells MC other than the sampled memory cell MC from when the erase voltage application operation (FIG. 12, FIG. 13) is performed once until the erase voltage application operation is performed again.

While the embodiment has described the example where the erase operation includes the pre-read operation and the pre-program operation depicted in FIG. 11 and the erase voltage application operation and the erase verify operation depicted in FIG. 12, the pre-read operation and the pre-program operation may be omitted. That is, as the erase operation, only the erase voltage application operation and the erase verify operation depicted in FIG. 12 may be performed.

Second Embodiment

Figure 19:
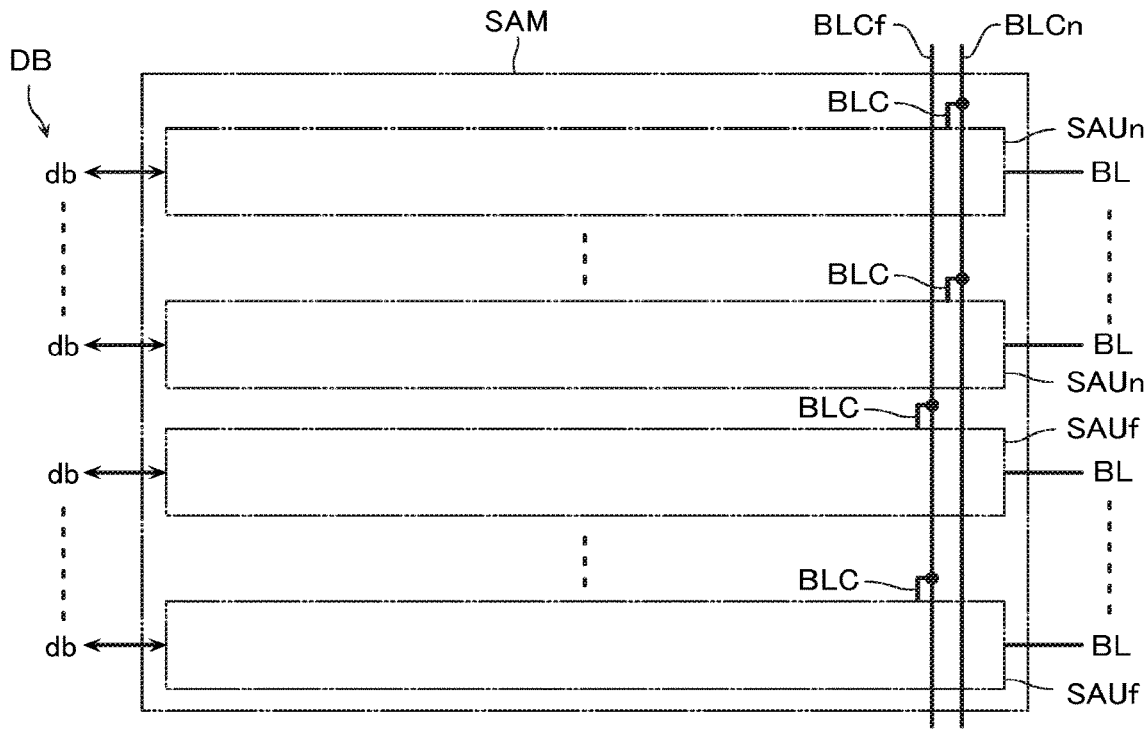
FIG. 19 is a schematic block diagram illustrating an exemplary configuration of a part of a semiconductor memory device according to a second embodiment.
Figure 20:
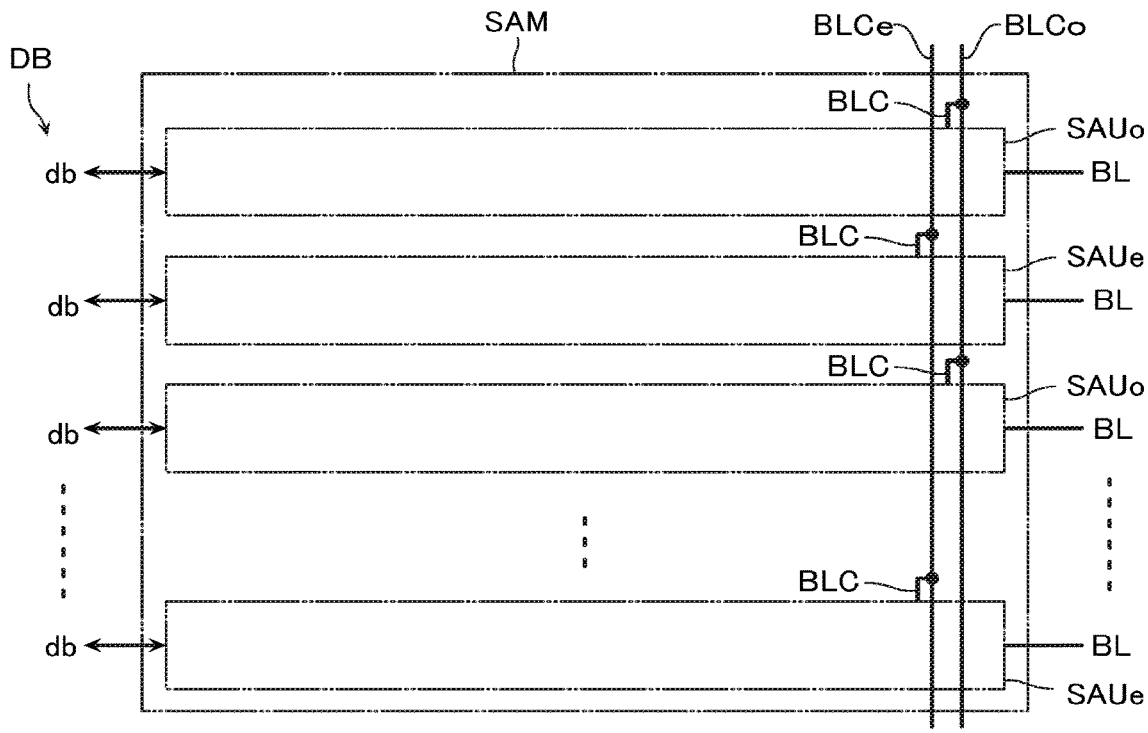
FIG. 20 is a schematic block diagram illustrating an exemplary configuration of a part of the semiconductor memory device according to the second embodiment.

Next, with reference to FIG. 19 and FIG. 20, a semiconductor memory device according to the second embodiment is described. FIG. 19 and FIG. 20 are schematic block diagrams illustrating exemplary configurations of the sense amplifier module SAM according to the embodiment. FIG. 19 illustrates the sense amplifier units SAU corresponding to the near bits and the far bits as "SAUn" and "SAUf," respectively. FIG. 20 illustrates the sense amplifier units SAU corresponding to odd bits and even bits as "SAUo" and "SAUe," respectively.

The first embodiment has described the example where the memory cells MC are sampled through the data operation of the data latches SDL. However, the memory cells MC can be sampled by methods other than that.

For example, as described with reference to FIG. 3, in the semiconductor memory device according to the first embodiment, the signal line BLC included in the sense amplifier units SAU is connected to all sense amplifier units SAU included in the sense amplifier module SAM.

Meanwhile, as illustrated in FIG. 19 and FIG. 20, in the semiconductor memory device according to the second embodiment, the signal lines BLC corresponding to the sampled memory cells MC and the signal lines BLC corresponding to the other memory cells MC are configured to be independently controllable.

For example, in the example of FIG. 19, the signal lines BLC corresponding to the near bits and the signal lines BLC corresponding to the far bits are configured to be independently controllable. For example, in the example illustrated in the drawing, the signal lines BLC corresponding to the near bits are connected to a common signal line BLCn, the signal lines BLC corresponding to the far bits are connected to a common signal line BLCf, and the signal lines BLCn and BLCf are configured to be electrically independent.

For example, in the example of FIG. 20, the signal lines BLC corresponding to the even bits and the signal lines BLC corresponding to the odd bits are configured to be independently controllable. For example, in the example illustrated in the drawing, the signal lines BLC corresponding to the even bits are connected to a common signal line BLCe, the signal lines BLC corresponding to the odd bits are connected to a common signal line BLCo, and the signal lines BLCe and BLCo are configured to be electrically independent.

In this configuration, the signal lines BLC corresponding to the memory cells MC sampled in the above-described pre-read operation and erase verify operation are turned into the "H" state and the signal lines BLC corresponding to the other memory cells MC are turned into the "L" state. It ensures sampling the memory cells MC without the data operation of the data latches SDL. Therefore, compared with the first embodiment, the high-speed erase operation can be expected.

While the examples of FIG. 19 and FIG. 20 have described the examples where the signal lines BLC are configured to be independently controllable between the plurality of sense amplifier units SAU, another signal line may be configured to be independently controllable. While the examples of FIG. 19 and FIG. 20 have described the examples where the plurality of sense amplifier units SAU are grouped into the two groups, the plurality of sense amplifier units SAU may be grouped into three or more groups.

Third Embodiment

Figure 21:
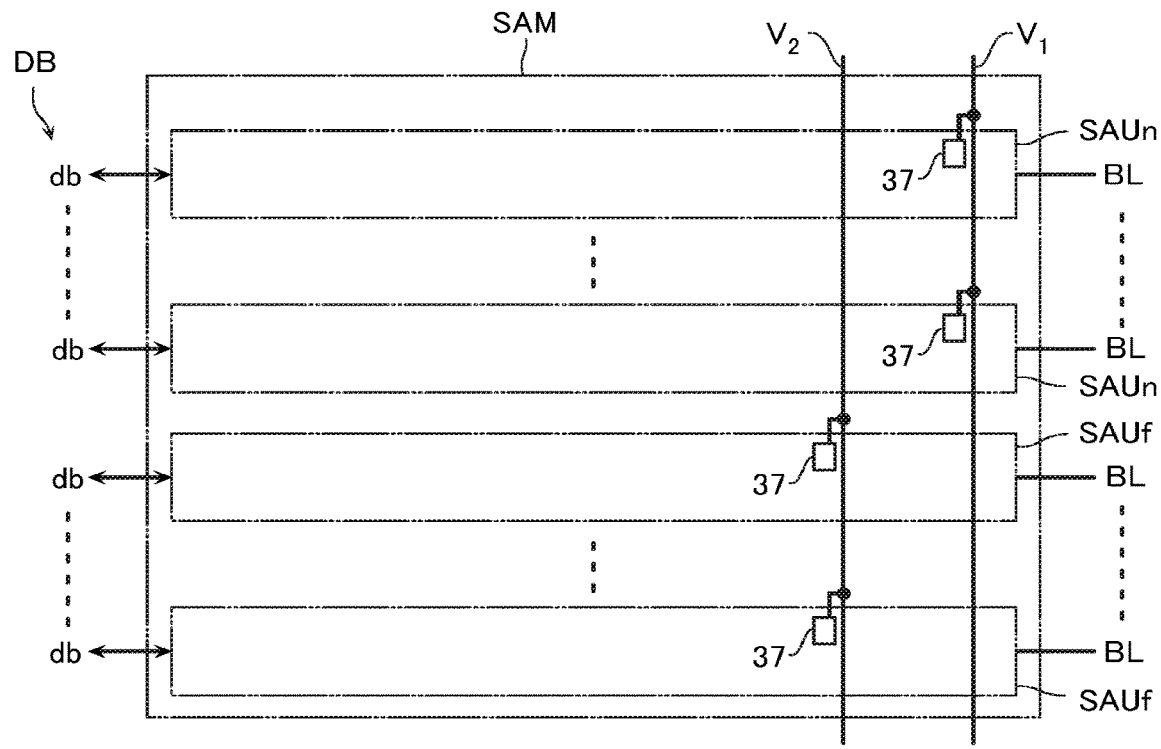
FIG. 21 is a schematic block diagram illustrating an exemplary configuration of a part of a semiconductor memory device according to a third embodiment.
Figure 22:
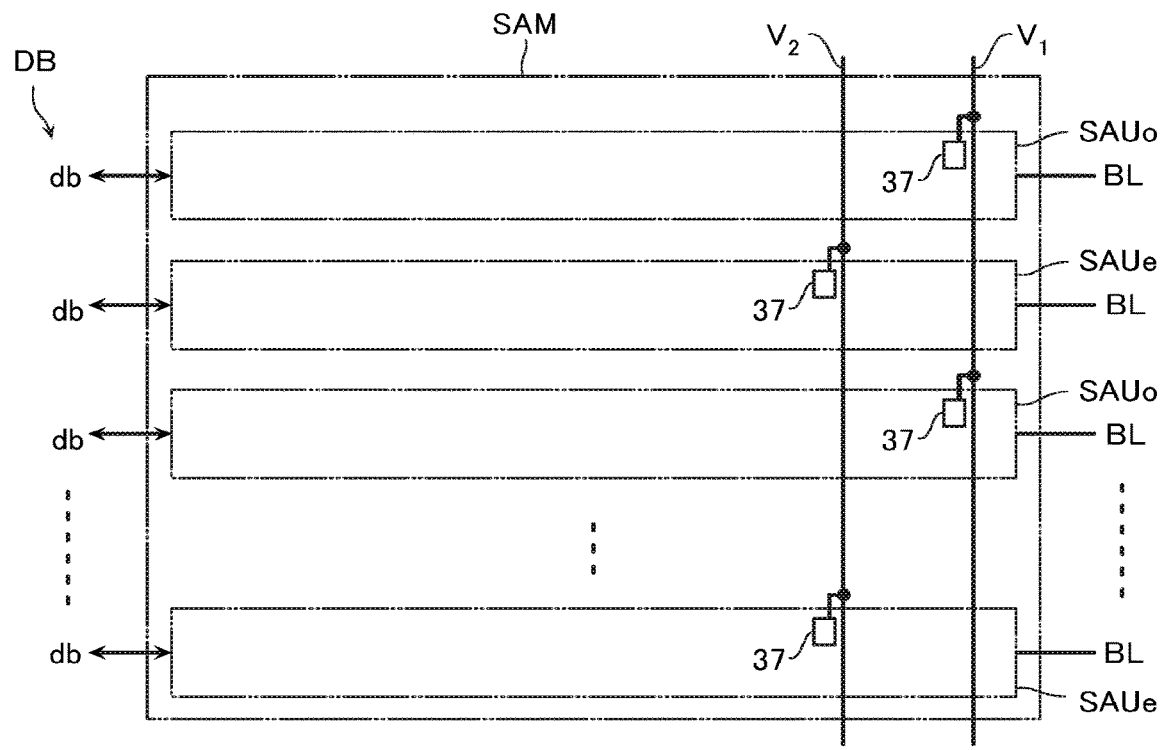
FIG. 22 is a schematic block diagram illustrating an exemplary configuration of a part of the semiconductor memory device according to the third embodiment.

Next, with reference to FIG. 21 and FIG. 22, a semiconductor memory device according to the third embodiment is described.

In the second embodiment, the example where the signal lines corresponding to the sampled memory cells MC and the signal lines corresponding to the other memory cells MC are configured to be independently controllable. However, the memory cells MC can be sampled by methods other than that.

For example, as illustrated in FIG. 21 and FIG. 22, in the semiconductor memory device according to the third embodiment, the one ends of the charge transistors 37, which have been described with reference to FIG. 4, are connected to a voltage supply line $V_1$ or $V_2$, not the power voltage supply line $V_{DD}$.

For example, the configuration of FIG. 21 is configured such that different voltages can be supplied to the sense amplifier units SAUn corresponding to the near bits and the sense amplifier units SAUf corresponding to the far bits. For example, in the example illustrated in the drawing, the one ends of the charge transistors 37 corresponding to the near bits are connected to the common voltage supply line $V_1$, one ends of the charge transistors 37 corresponding to the far bits are connected to the common voltage supply line $V_2$, and the voltage supply lines $V_1$ and $V_2$ are configured to be electrically independent.

For example, the configuration of FIG. 22 is configured such that different voltages can be supplied to the sense amplifier units SAUe corresponding to the even bits and the sense amplifier units SAUo corresponding to the odd bits. For example, in the example illustrated in the drawing, one ends of the charge transistors 37 corresponding to the odd bits are connected to the common voltage supply line $V_1$, and the one ends of the charge transistors 37 corresponding to the even bits are connected to the common voltage supply line $V_2$, and the voltage supply lines $V_1$ and $V_2$ are configured to be electrically independent.

In this configuration, the ground voltage $V_{SS}$ is supplied to one of the voltage supply lines $V_1$ and $V_2$ in the above-described pre-read operation and erase verify operation and the read bit line voltage $V_{BLR}$ is supplied to the other. It ensures sampling the memory cells MC without the data operation of the data latches SDL. Therefore, compared with the first embodiment, the high-speed erase operation can be expected.

While the examples of FIG. 21 and FIG. 22 have described the examples where the voltage supply lines connected to the one ends of the charge transistors 37 are configured to be independently controllable between the plurality of sense amplifier units SAU, another voltage supply line may be configured to be independently controllable. While the examples of FIG. 21 and FIG. 22 have described the examples where the plurality of sense amplifier units SAU are grouped into the two groups, the plurality of sense amplifier units SAU may be grouped into three or more groups.

Fourth Embodiment

Figure 23:
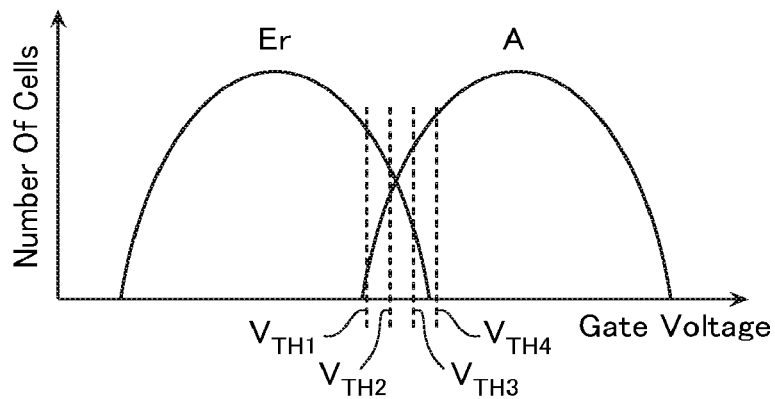
FIG. 23 is a schematic histogram for describing a semiconductor memory device according to a fourth embodiment.
Figure 24:
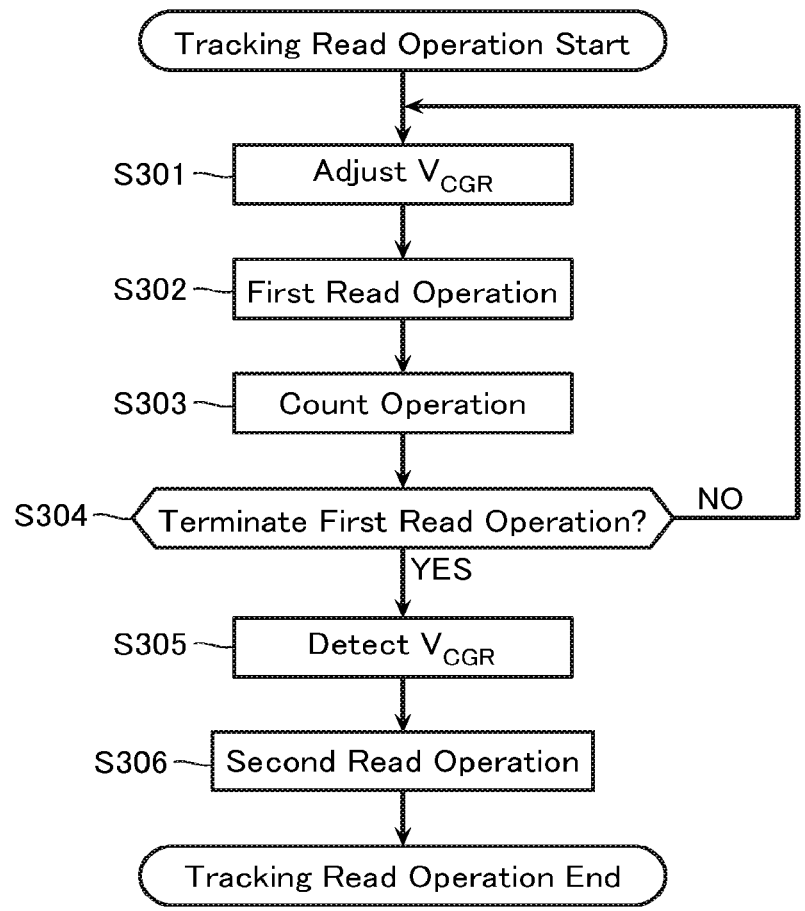
FIG. 24 is a schematic flowchart for describing a tracking read operation.

Next, with reference to FIG. 23 and FIG. 24, a semiconductor memory device according to the fourth embodiment is described.

The first embodiment to the third embodiment have described the example where the memory cells MC are sampled in the pre-read operation and the erase verify operation. However, the memory cells MC can be sampled in operations other than the pre-read operation and the erase verify operation.

For example, there may be a case where a tracking read operation is performed in the read operation. FIG. 23 is a schematic histogram for describing the tracking read operation. FIG. 24 is a schematic flowchart for describing the tracking read operation.

As illustrated in FIG. 23, the threshold voltages of the plurality of memory cells MC connected to the selected word line WL3 are distributed into a predetermined range. For example, a distribution Er in the drawing corresponds to the threshold distribution of the memory cells MC in which the data "0" are stored. For example, a distribution A corresponds to the threshold distribution of the memory cells MC in which the data "1" are stored.

Here, as illustrated in the drawing, the distribution Er partially overlaps with the distribution A in some cases. That is, there may be a case where some memory cells MC storing the data "0" have the threshold voltages larger than those of some memory cells MC storing the data "1." When the read operation is performed on such memory cells MC, bits of the memory cells MC result in error bits. When the error bits are equal to or less than the predetermined count, error detection and correction (ECC) allows appropriately reading the data. However, when the error bits become larger than the predetermined count, the data cannot be appropriately read in some cases.

Therefore, in the tracking read operation, while adjusting the read voltage $V_{CGR}$ to a plurality of threshold voltages $V_{TH1}$ to $V_{TH4}$ as illustrated in the drawing, a plurality of first read operations are performed to detect a threshold voltage $V_{TH}$ where the error bits become the least. Then, the second read operation is performed with the use of this threshold voltage $V_{TH}$ as the read voltage $V_{CGR}$.

At Step S301 (FIG. 24), the read voltage $V_{CGR}$ is adjusted. For example, the read voltage $V_{CGR}$ is set to the threshold voltage $V_{TH1}$ in a first loop, and the read voltage $V_{CGR}$ is set to the threshold voltage $V_{TH2}$ in a second loop. Similarly, the read voltage $V_{CGR}$ is set to the threshold voltage $V_{TH3}$ or the threshold voltage $V_{TH4}$ in a third loop or a fourth loop.

At Step S302, the first read operation is performed with the use of the read voltage $V_{CGR}$ adjusted at Step S301. The first read operation is performed similarly to the pre-read operation (FIG. 15, FIG. 16).

At Step S303, the count operation is performed. In the count operation, for example, the number of memory cells MC in the ON state is counted based on the data latched in the data latch XDL in the sense amplifier module SAM (FIG. 3). In the count operation, the memory cells MC may be sampled when the number of memory cells MC in the ON state is counted.

At Step S304, whether to terminate the first read operation or not is determined. When the first read operation is not terminated, the process proceeds to Step S301 and when terminated, the process proceeds to Step S305.

At Step S305, the threshold voltage $V_{TH}$ where the error bits become the least is detected. For example, a difference between the number of memory cells MC in the ON state in the first read operation performed at the k-th (k is a natural number) time and the number of memory cells MC in the ON state in the first read operation performed at the k+1-th time is calculated. Next, based on this calculated difference, the threshold voltage $V_{TH}$ where the error bits become the least is detected.

At Step S306, the second read operation is performed. The second read operation is basically performed similarly to the read operation (FIG. 7). In the second read operation, the threshold voltage $V_{TH}$ detected at Step S305 is used as the read voltage $V_{CGR}$.

In the embodiment, the first read operation (S302) is not performed on the memory cells MC other than the sampled memory cells MC from when the read voltage $V_{CGR}$ is once adjusted (S301) until the read voltage $V_{CGR}$ is adjusted again (S301).

Fifth Embodiment

Figure 25:
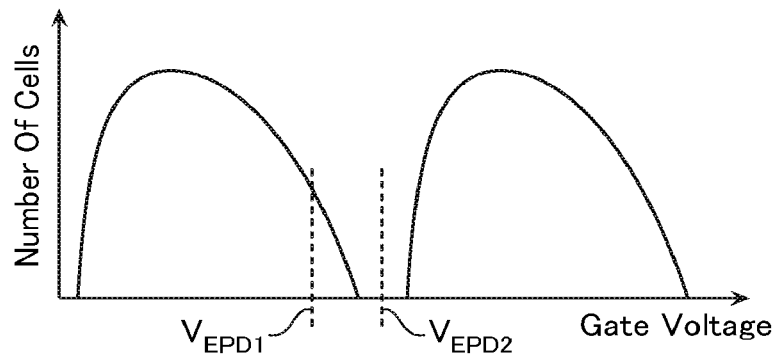
FIG. 25 is a schematic histogram for describing a semiconductor memory device according to a fifth embodiment.
Figure 26:
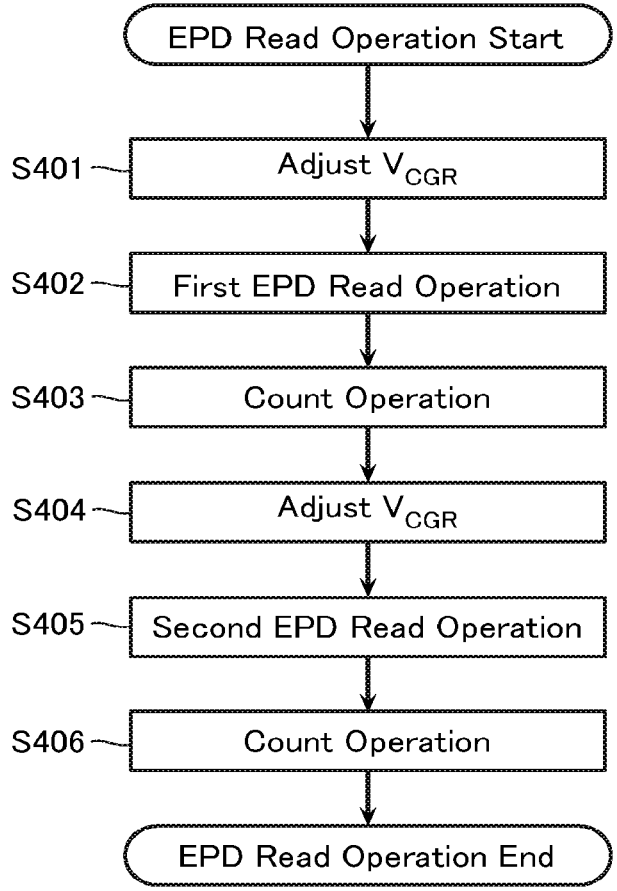
FIG. 26 is a schematic flowchart for describing an EPD read operation.

Next, with reference to FIG. 25 and FIG. 26, a semiconductor memory device according to the fifth embodiment is described.

The first embodiment to the fourth embodiment have described the examples where the memory cells MC are sampled in the pre-read operation, the erase verify operation, and the tracking read operation. However, the memory cells MC can be sampled in operations other than the pre-read operation, the erase verify operation, and the tracking read operation.

For example, there may be a case where an EPD read operation is performed in the write operation. In the EPD operation, an expansion of an upper hem in the threshold distribution of the memory cells MC in the erase state is confirmed after termination of the operations described with reference to FIG. 8 to FIG. 10. FIG. 25 is a schematic histogram for describing the EPD read operation. FIG. 26 is schematic flowchart for describing the EPD read operation.

As illustrated in FIG. 25, when the program operation is performed on the plurality of memory cells MC connected to the selected word line WL3, not only the threshold voltages of write memory cells, the threshold voltages of the inhibited memory cell MCs sometimes varies. In the EPD read operation, the variation in the threshold voltages of the inhibited memory cell MCs is detected.

At Step S401 (FIG. 24), the read voltage $V_{CGR}$ is adjusted. For example, the read voltage $V_{CGR}$ is set to an EPD read voltage $V_{EPD1}$ (FIG. 25).

At Step S402, the first EPD read operation is performed. The first EPD read operation is performed similarly to the pre-read operation (FIG. 15, FIG. 16).

At Step S403, the count operation is performed. In the count operation, for example, the number of memory cells MC in the ON state is counted based on the data latched in the data latch XDL in the sense amplifier module SAM (FIG. 3). In the count operation, the memory cells MC may be sampled when the number of memory cells MC in the ON state is counted.

At Step S404, the read voltage $V_{CGR}$ is adjusted. For example, the read voltage $V_{CGR}$ is set to an EPD read voltage $V_{EPD2}$ (FIG. 25). The EPD read voltage $V_{EPD2}$ is larger than the EPD read voltage $V_{EPD1}$.

At Step S405, the second EPD read operation is performed. The second EPD read operation is performed similarly to the pre-read operation (FIG. 15, FIG. 16).

At Step S406, the count operation is performed. In the count operation, for example, the number of memory cells MC in the ON state is counted based on the data latched in the data latch XDL in the sense amplifier module SAM (FIG. 3). In the count operation, the memory cells MC may be sampled when the number of memory cells MC in the ON state is counted.

Afterwards, a comparison between the numbers of memory cells MC in the ON state counted at Step S403 and Step S406 allows calculating the number of memory cells MC in which the threshold voltages are in the range between the EPD read voltage $V_{EPD1}$ and the EPD read voltage $V_{EPD2}$, its proportion, and the like.

In the embodiment, the count operation of S403 is not performed to the memory cells MC other than the memory cells MC sampled in the first EPD read operation (S402) in one EPD read operation. Similarly, the count operation of S406 is not performed to the memory cells MC other than the memory cells MC sampled in the second EPD read operation (S405).

Others

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor memory device comprising:
   a first bit line and a second bit line;
   a first memory transistor connected to the first bit line;
   a second memory transistor connected to the second bit line;
   a source line connected to the first memory transistor and the second memory transistor; and
   a word line connected to a gate electrode of the first memory transistor and a gate electrode of the second memory transistor, wherein
   in an erase operation that erases data in the first memory transistor and the second memory transistor:
     a first erase voltage application operation is performed;
     an erase verify operation is performed on only one of the first memory transistor and the second memory transistor; and
     a second erase voltage application operation is performed without performing the erase verify operation on another of the first memory transistor and the second memory transistor.

2. The semiconductor memory device according to claim 1, comprising:
   a first voltage supply line and a second voltage supply line;
   a first connection transistor connected between the first bit line and the first voltage supply line;
   a second connection transistor connected between the first bit line and the second voltage supply line;
   a first latch circuit connected to a gate electrode of the first connection transistor and a gate electrode of the second connection transistor;
   a third connection transistor connected between the second bit line and the first voltage supply line;
   a fourth connection transistor connected between the second bit line and the second voltage supply line; and
   a second latch circuit connected to a gate electrode of the third connection transistor and a gate electrode of the fourth connection transistor, wherein
   in the erase operation, different data are latched in the first latch circuit and the second latch circuit.

3. The semiconductor memory device according to claim 1, comprising:
   a voltage supply line;
   a fifth connection transistor connected between the voltage supply line and the first bit line; and
   a sixth connection transistor connected between the voltage supply line and the second bit line, wherein
   in the erase operation, different voltages are supplied to a gate electrode of the fifth connection transistor and a gate electrode of the sixth connection transistor.

4. The semiconductor memory device according to claim 1, comprising:
   a third voltage supply line connected to the first bit line; and
   a fourth voltage supply line connected to the second bit line, wherein
   in the erase operation, different voltages are supplied to the third voltage supply line and the fourth voltage supply line.

5. The semiconductor memory device according to claim 1, comprising a plurality of third memory transistors, wherein
   the erase verify operation is performed on the plurality of third memory transistors after the first erase voltage application operation and before the second erase voltage application operation, and
   a count operation is performed on the plurality of third memory transistors after the erase verify operation and before the second erase voltage application operation.

6. The semiconductor memory device according to claim 5, comprising a plurality of fourth memory transistors, wherein
   the erase verify operation is not performed on the plurality of fourth memory transistors after the first erase voltage application operation and before the second erase voltage application operation, and
   the count operation is not performed on the plurality of fourth memory transistors after the erase verify operation and before the second erase voltage application operation.

7. The semiconductor memory device according to claim 6, wherein
   one of the plurality of third memory transistors and the plurality of fourth memory transistors corresponds to an even bit, and
   the other of the plurality of third memory transistors and the plurality of fourth memory transistors corresponds to an odd bit.

8. The semiconductor memory device according to claim 6, comprising a row decoder connected to the word line, wherein
   one of the plurality of third memory transistors and the plurality of fourth memory transistors is nearer to the row decoder than the other of the plurality of third memory transistors and the plurality of fourth memory transistors.

9. A semiconductor memory device comprising:
   a first bit line and a second bit line;
   a first memory transistor connected to the first bit line;
   a second memory transistor connected to the second bit line;
   a source line connected to the first memory transistor and the second memory transistor; and
   a word line connected to a gate electrode of the first memory transistor and a gate electrode of the second memory transistor, wherein
   in an erase operation that erases data in the first memory transistor and the second memory transistor:
     the erase operation starts;
     a pre-read operation is performed on only one of the first memory transistor and the second memory transistor; and
     an erase voltage application operation is performed without performing the pre-read operation on the other of the first memory transistor and the second memory transistor.

10. The semiconductor memory device according to claim 9, comprising:
    a first voltage supply line and a second voltage supply line;
    a first connection transistor connected between the first bit line and the first voltage supply line;

a second connection transistor connected between the first bit line and the second voltage supply line;

a first latch circuit connected to a gate electrode of the first connection transistor and a gate electrode of the second connection transistor;

a third connection transistor connected between the second bit line and the first voltage supply line;

a fourth connection transistor connected between the second bit line and the second voltage supply line; and a second latch circuit connected to a gate electrode of the third connection transistor and a gate electrode of the fourth connection transistor, wherein in the erase operation, different data are latched in the first latch circuit and the second latch circuit.

11. The semiconductor memory device according to claim 9, comprising:

a voltage supply line;

a fifth connection transistor connected between the voltage supply line and the first bit line; and a sixth connection transistor connected between the voltage supply line and the second bit line, wherein in the erase operation, different voltages are supplied to a gate electrode of the fifth connection transistor and a gate electrode of the sixth connection transistor.

12. The semiconductor memory device according to claim 9, comprising:

a third voltage supply line connected to the first bit line; and a fourth voltage supply line connected to the second bit line, wherein in the erase operation, different voltages are supplied to the third voltage supply line and the fourth voltage supply line.

13. The semiconductor memory device according to claim 9, comprising a plurality of third memory transistors, wherein the pre-read operation is performed on the plurality of third memory transistors after the start of the erase operation and before the erase voltage application operation, and a count operation is performed on the plurality of third memory transistors after the pre-read operation and before the erase voltage application operation.

14. The semiconductor memory device according to claim 13, comprising a plurality of fourth memory transistors, wherein the pre-read operation is not performed on the plurality of fourth memory transistors after the start of the erase operation and before the erase voltage application operation, and the count operation is not performed on the plurality of fourth memory transistors after the pre-read operation and before the erase voltage application operation.

15. The semiconductor memory device according to claim 14, wherein one of the plurality of third memory transistors and the plurality of fourth memory transistors corresponds to an even bit, and the other of the plurality of third memory transistors and the plurality of fourth memory transistors corresponds to an odd bit.

16. The semiconductor memory device according to claim 14, comprising a row decoder connected to the word line, wherein one of the plurality of third memory transistors and the plurality of fourth memory transistors is nearer to the row decoder than the other of the plurality of third memory transistors and the plurality of fourth memory transistors.

17. A semiconductor memory device comprising:

a memory block including a plurality of memory transistors;

a peripheral circuit connected to the memory block; and a pad electrode with which electric power can be supplied to the peripheral circuit, wherein when a read operation is performed on the memory transistor while the plurality of memory transistors included in the memory block are in an erase state, a first current flows through the pad electrode, when an erase operation is performed on the memory transistors while the plurality of memory transistors included in the memory block are in the erase state, a second current flows through the pad electrode in a pre-read operation in the erase operation, and the second current is smaller than the first current.

* * * * *